(12) United States Patent
Imai et al.

(10) Patent No.: US 12,712,499 B2
(45) Date of Patent: Aug. 18, 2026

(54) POWER AMPLIFIER MODULE

(71) Applicant: Murata Manufacturing Co., Ltd., Kyoto (JP)

(72) Inventors: Shohei Imai, Kyoto (JP); Satoshi Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 394 days.

(21) Appl. No.: 18/362,424

(22) Filed: Jul. 31, 2023

(65) Prior Publication Data

US 2023/0378922 A1 Nov. 23, 2023

Related U.S. Application Data

(63) Continuation of application No. PCT/JP2022/003563, filed on Jan. 31, 2022.

(30) Foreign Application Priority Data

Feb. 2, 2021 (JP) ................................ 2021-014735

(51) Int. Cl.
*H03F 1/02* (2006.01)
*H03F 3/21* (2006.01)

(52) U.S. Cl.
CPC ........... *H03F 3/211* (2013.01); *H03F 1/0216* (2013.01); *H03F 1/0288* (2013.01); *H03F 2200/451* (2013.01)

(58) Field of Classification Search
CPC .................................... H03F 1/02; H03F 1/07
USPC ............................................. 330/124 R, 295
See application file for complete search history.

(56) References Cited

U.S. PATENT DOCUMENTS

| | | | | |
|---|---|---|---|---|
| 11,043,921 | B2 * | 6/2021 | Scott | H03F 3/24 |
| 11,881,818 | B2 * | 1/2024 | Pehlke | H04B 1/40 |
| 2011/0248784 | A1 | 10/2011 | Grondahl | |
| 2016/0204743 | A1 * | 7/2016 | Otsuki | H03F 3/211 330/295 |
| 2016/0241209 | A1 | 8/2016 | Lehtola | |
| 2020/0028472 | A1 | 1/2020 | Scott et al. | |

FOREIGN PATENT DOCUMENTS

| | | | |
|---|---|---|---|
| CN | 102549915 | A | 7/2012 |
| JP | 2015-046795 | A | 3/2015 |
| WO | 2014/141539 | A1 | 9/2014 |

OTHER PUBLICATIONS

International Search Report for PCT/JP2022/003563 dated Apr. 26, 2022.

* cited by examiner

*Primary Examiner* — Henry Choe
(74) *Attorney, Agent, or Firm* — McDonald Hopkins LLC

(57) ABSTRACT

A power amplifier module includes a carrier circuit including at least one carrier amplifier; a peak circuit including at least one peak amplifier; a carrier control circuit that controls base current or gate voltage of a certain carrier amplifier in the carrier circuit; and a carrier output circuit that is connected to a carrier amplifier at an output side in the carrier circuit and that supplies a carrier control signal for controlling the base current or the gate voltage of the certain carrier amplifier to the carrier control circuit.

10 Claims, 16 Drawing Sheets

FIG. 3

V
SATURATION
SIGNAL
I
SATURATION 160c
162c
161c
163c
Q41
Q42
Q43
Q44
D41
D42
D43
R41
R42
R43
R44
C41
B1
$V_{CC}3$
$I_{S1}$
Dcont1
170
CARRIER CONTROL CIRCUIT

POWER AMPLIFIER MODULE

CROSS REFERENCE TO RELATED APPLICATION

This is a continuation of International Application No. PCT/JP2022/003563 filed on Jan. 31, 2022 which claims priority from Japanese Patent Application No. 2021-014735 filed on Feb. 2, 2021. The contents of these applications are incorporated herein by reference in their entireties.

BACKGROUND ART

Technical Field

The disclosure relates to a power amplifier module.

Doherty amplifiers are highly efficient power amplifiers. In the general Doherty amplifier, a carrier amplifier that operates regardless of the power level of an input signal is connected in parallel to a peak amplifier that is turned off when the power level of the input signal is low and that is turned on when the power level of the input signal is high. When the power level of the input signal is high, the Doherty amplifier operates while the carrier amplifier keeps saturation at a saturation output power level. Accordingly, the Doherty amplifier is capable of improving the efficiency, compared with normal power amplifiers. As described above, optimizing the level of C-class bias of the peak amplifier operates the peak amplifier at a timing when the carrier amplifier comes close to the saturation to cause the Doherty amplifier to operate at an appropriate timing.

Patent Document 1: U.S. Patent Application Publication No. 2020/0028472

BRIEF SUMMARY

A Doherty amplifier described in Patent Document 1 includes a detection circuit that detects base current of a carrier amplifier. The Doherty amplifier controls the bias of a peak amplifier based on the base current detected with the detection circuit. In other words, the Doherty amplifier identifies the carrier amplifier that comes close to the saturation based on the base current detected with the detection circuit to control the operation of the peak amplifier. Accordingly, the Doherty amplifier is capable of improving gain characteristics by immediately detecting the saturation of the carrier amplifier to operate the peak amplifier. However, in the Doherty amplifier described in Patent Document 1, it is not possible to control the operation of the carrier amplifier although the operation of the peak amplifier is controlled based on the carrier amplifier that comes close to the saturation. Accordingly, with the Doherty amplifier, it is not possible to prevent damage of the Doherty amplifier, which is caused by the saturation of the carrier amplifier.

The disclosure provides a power amplifier module capable of detecting the saturation of a carrier amplifier to prevent the damage of the carrier amplifier.

A power amplifier module according to one aspect of the present disclosure includes a carrier circuit including at least one carrier amplifier; a peak circuit including at least one peak amplifier; a carrier control circuit that controls base current or gate voltage of a certain carrier amplifier in the carrier circuit; and a carrier output circuit that is connected to a carrier amplifier at an output side in the carrier circuit and that supplies a carrier control signal for controlling the base current or the gate voltage of the certain carrier amplifier to the carrier control circuit.

According to the disclosure, it is possible to provide a power amplifier module capable of detecting the saturation of a carrier amplifier to prevent the damage of the carrier amplifier.

BRIEF DESCRIPTION OF THE DRAWINGS

FIG. 3 is a graph illustrating an example of the relationship between base current of an output amplifier and voltage of a signal Dcont1.

DETAILED DESCRIPTION

Figure 1:
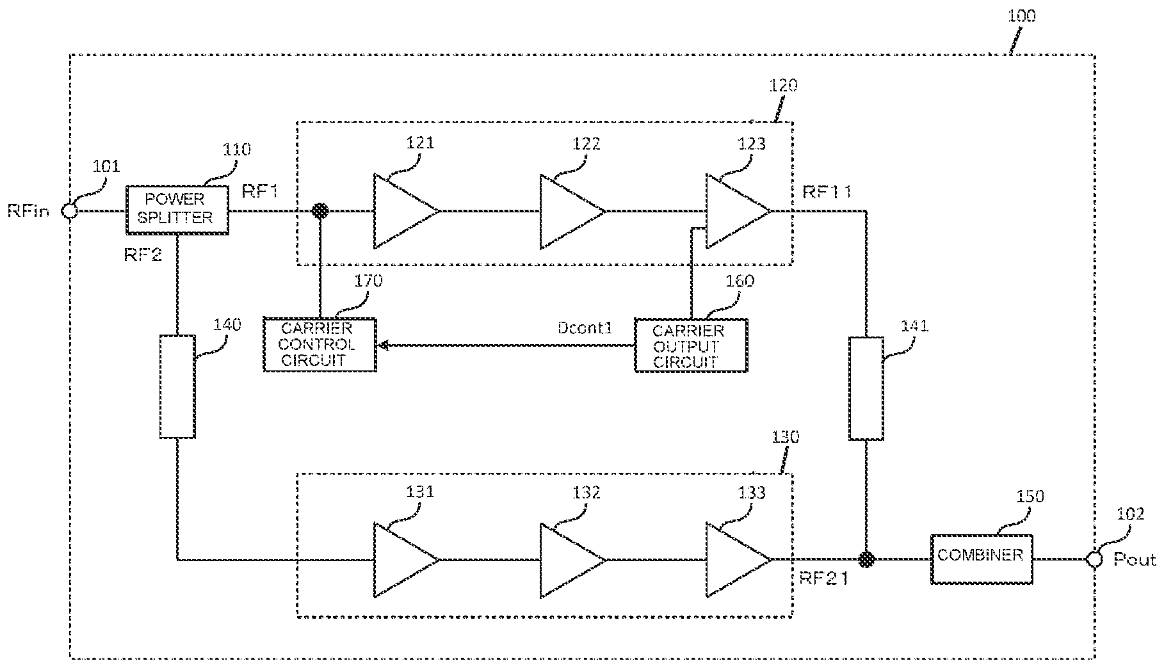
FIG. 1 is a diagram illustrating an example of the configuration of a power amplifier module of a first embodiment.

The respective embodiments of the disclosure will herein be described with reference to the respective drawings. Circuit elements having the same reference numerals and letters represent the same circuit elements and a duplicated description of such circuit elements is omitted herein.

===Configuration of Power Amplifier Module 100 According to First Embodiment===

A configuration of a power amplifier module according to a first embodiment will now be described with reference to FIG. 1. FIG. 1 is a diagram illustrating an example of the configuration of a power amplifier module 100 of the first embodiment. The power amplifier module 100 is mounted in, for example, a mobile phone and is used to amplify the power of a signal to be transmitted to a base station. The power amplifier module 100 is capable of amplifying the powers of signals conforming to communication standards, such as the second generation mobile communication system (2G), the third generation mobile communication system (3G), the fourth generation mobile communication system (4G), the fifth generation mobile communication system (5G), Long Term Evolution (LTE)-frequency Division Duplex (FDD), LTE-Time Division Duplex (TDD), LTE-Advanced, and LTE-Advanced Pro. The communication standards of the signals to be amplified by the power amplifier module 100 are not limited to the above ones.

As illustrated in FIG. 1, the power amplifier module 100 is configured so as to include, for example, a Doherty amplifier circuit. The power amplifier module 100 includes, for example, an input terminal 101, an output terminal 102, a power splitter 110, a carrier circuit 120, a peak circuit 130, a peak phase shifter 140, a carrier phase shifter 141, a combiner 150, a carrier output circuit 160, and a carrier control circuit 170.

The power amplifier module 100 detects saturation of a carrier amplifier provided at the output side in the carrier circuit 120, for example, based on base current or gate current of the carrier amplifier. When the power amplifier module 100 detects the saturation of the carrier amplifier at the output side, the power amplifier module 100 decreases a bias point of a certain carrier amplifier in the carrier circuit 120. Accordingly, since this relieves the saturation state of the carrier amplifier at the output side in the power amplifier module 100, it is possible to prevent damage of the power amplifier module 100, which is caused by the saturation of the carrier amplifier. The "saturation state" includes, for example, a "state in which gain is reduced with increasing input."

The input terminal 101 is, for example, a terminal through which a harmonic-wave signal (hereinafter referred to as a "signal RFin") is input.

The output terminal 102 is, for example, a terminal through which an amplified signal (hereinafter referred to as a "signal Pout") resulting from amplification of the signal RFin is output.

The power splitter 110 splits, for example, the signal RFin into a signal (hereinafter referred to as a "signal RF1") to be input into the carrier circuit 120 and a signal (hereinafter referred to as a "signal RF2") to be input into the peak circuit 130. Here, the phase of the signal RF2 is delayed from the phase of the signal RF1 by approximately 90 degrees, for example, via the peak phase shifter 140 described below. The power splitter 110 may be, for example, a distributed constant circuit, such as a coupled line 3 dB coupler, or a Wilkinson power divider. The representation of "approximately 90 degrees" includes, for example, a range from 45 degrees to 135 degrees.

The carrier circuit 120 is composed of, for example, multiple amplifiers that are connected in series to each other. The carrier circuit 120 is configured so as to include, for example, a buffer amplifier 121, a driver amplifier 122, and an output amplifier 123. The buffer amplifier 121 amplifies the signal RF1 that is input and outputs the amplified signal RF1. The driver amplifier 122 amplifies the signal RF1 amplified by the buffer amplifier 121 and outputs the amplified signal RF1. The output amplifier 123 amplifies the signal amplified by the driver amplifier 122 and outputs an amplified signal (hereinafter referred to as a "signal RF11"). The buffer amplifier 121, the driver amplifier 122, and the output amplifier 123 are each biased to, for example, an A-class amplifier, an AB-class amplifier, or a B-class amplifier. In other words, the buffer amplifier 121, the driver amplifier 122, and the output amplifier 123 each amplifies the input signal and output the amplified signal regardless of the power level of the input signal, such as small instant input power.

Although the carrier circuit 120 is described above so as to include the buffer amplifier 121, the driver amplifier 122, and the output amplifier 123, the carrier circuit 120 is not limited to this. For example, the carrier circuit 120 may be composed of only the output amplifier 123, may be composed of two amplifiers, or may be composed of four or more amplifiers. The carrier circuit 120 is hereinafter described so as to include the buffer amplifier 121, the driver amplifier 122, and the output amplifier 123 for convenience.

The peak circuit 130 is composed of, for example, multiple amplifiers that are connected in series to each other. The peak circuit 130 is configured so as to include, for example, a buffer amplifier 131, a driver amplifier 132, and an output amplifier 133. The buffer amplifier 131 amplifies the signal RF2 that is input and outputs the amplified signal RF2. The driver amplifier 132 amplifies the signal RF2 amplified by the buffer amplifier 131 and outputs the amplified signal RF2. The output amplifier 133 amplifies the signal amplified by the driver amplifier 132 and outputs an amplified signal (hereinafter referred to as a "signal RF21"). The buffer amplifier 131, the driver amplifier 132, and the output amplifier 133 are each biased to, for example, an A-class amplifier, an AB-class amplifier, a B-class amplifier, or a C-class amplifier. The same circuit configuration may be used for the amplifiers composing the carrier circuit 120 and the peak circuit 130.

Although the peak circuit 130 is described above so as to include the buffer amplifier 131, the driver amplifier 132, and the output amplifier 133, the peak circuit 130 is not limited to this. For example, the peak circuit 130 may be composed of only the output amplifier 133, may be composed of two amplifiers, or may be composed of four or more amplifiers. The peak circuit 130 is desirably composed of, for example, the amplifiers of the same number as that of the carrier amplifiers in the carrier circuit 120. The peak circuit 130 is hereinafter described so as to include the buffer amplifier 131, the driver amplifier 132, and the output amplifier 133 for convenience.

The peak phase shifter 140 is, for example, a ¼-wavelength line connected to the input side of the peak circuit 130. The carrier phase shifter 141 is, for example, a ¼-wavelength line connected to the output side of the carrier circuit 120. Accordingly, load impedance viewed at the output end of the carrier amplifier 113 is capable of being varied to realize the high efficiency of the carrier amplifier 113. The peak phase shifter 140 may be realized using a lumped parameter element.

The combiner 150 combines the signal RF11, which is output from the carrier circuit 120 and which passes through the carrier phase shifter 141, with the signal RF21, which is output from the peak circuit 130, to output the amplified signal Pout.

Figure 2:
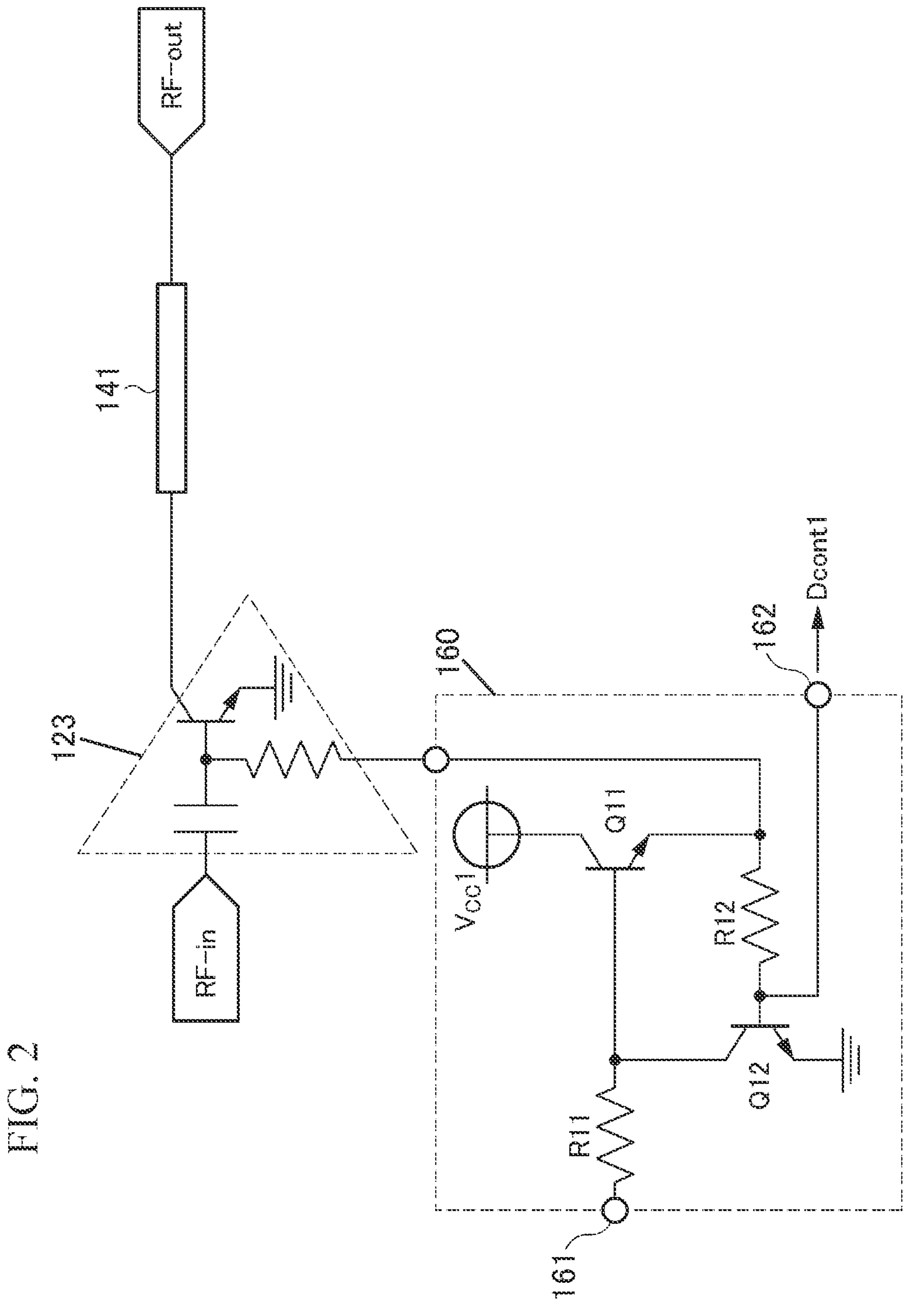
FIG. 2 is a diagram illustrating an example of the configuration of a carrier output circuit according to the first embodiment.

For example, the carrier output circuit 160 supplies bias current to the output amplifier 123 in the carrier circuit 120 and detects the base current of the output amplifier 123. The carrier output circuit 160 outputs a signal (hereinafter referred to as a "signal Dcont1") indicating that the output amplifier 123 is saturated based on the base current of the output amplifier 123. A configuration of the carrier output circuit 160 will now be described with reference to FIG. 2. FIG. 2 is a diagram illustrating an example of the configuration of the carrier output circuit 160 according to the first embodiment. Although the output amplifier 123 is configured so as to include a bipolar transistor in FIG. 2, the output amplifier 123 may be, for example, a field effect transistor, instead of the bipolar transistor. In this case, the base of the output amplifier 123 is replaced with the gate of the output amplifier 123 in the following description. As illustrated in FIG. 2, the carrier output circuit 160 includes, for example, an input terminal 161, an output terminal 162, a transistor Q11, a transistor Q12, a resistor R11, and a resistor R12. The input terminal 161 is a terminal to which a control signal for controlling the bias current is supplied. The output terminal 162 is a terminal through which the signal Dcont1 is output. The transistor Q11 is a transistor that supplies the bias current to the output amplifier 123. For example, the collector of the transistor Q11 is connected to a power supply Vcc1 and the emitter thereof is connected to the base of the output amplifier 123 via a resistor. The control signal for controlling the bias current is supplied to the base of the transistor Q11 via, for example, the resistor R11. The collector of the transistor Q12 is connected to the base of the transistor Q11, the base thereof is connected to the emitter of the transistor Q11 via the resistor R12, and the emitter thereof is grounded. The output terminal 162 is connected to a node between the base of the transistor Q12 and the resistor R12.

Figure 3:
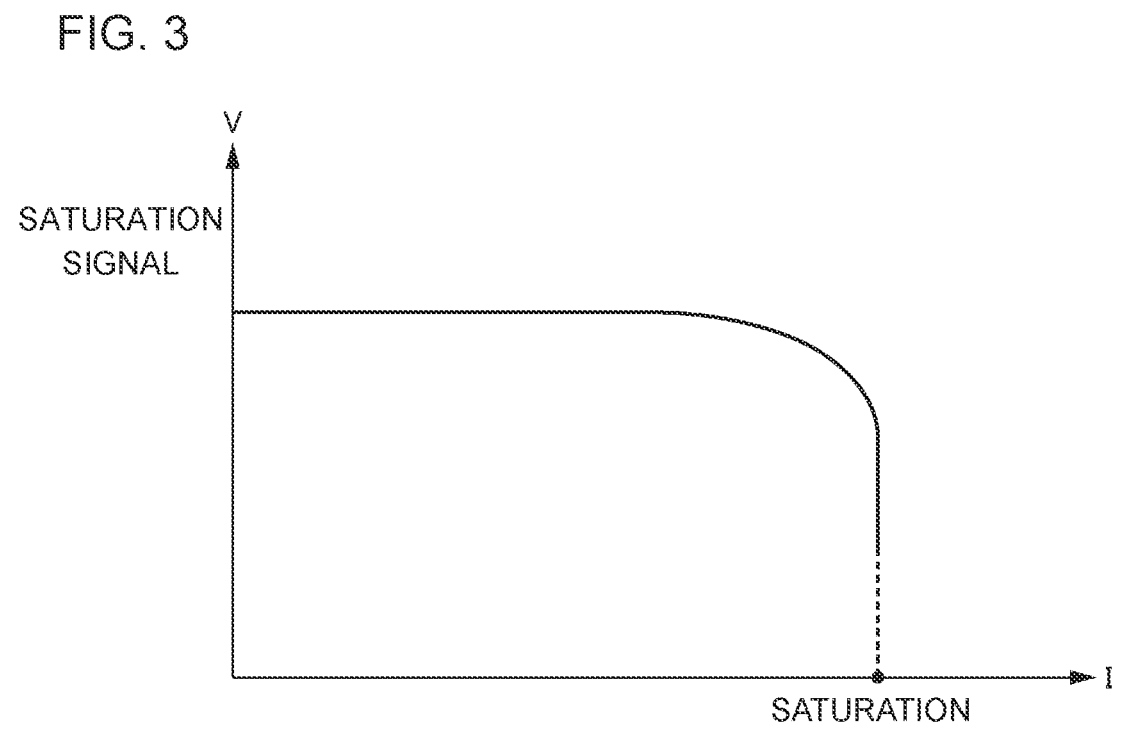

An example of the signal Dcont1 output from the carrier output circuit 160 will now be described with reference to FIG. 3. FIG. 3 is a graph illustrating an example of the relationship between the base current of the output amplifier 123 and the voltage of the signal Dcont1. Referring to FIG. 3, the horizontal axis represents the base current of the output amplifier 123 and the vertical axis represents the voltage of the signal Dcont1. As indicated in FIG. 3, the carrier output circuit 160 outputs the signal Dcont1 of low voltage at the base current when the output amplifier 123 is saturated.

Figure 4:
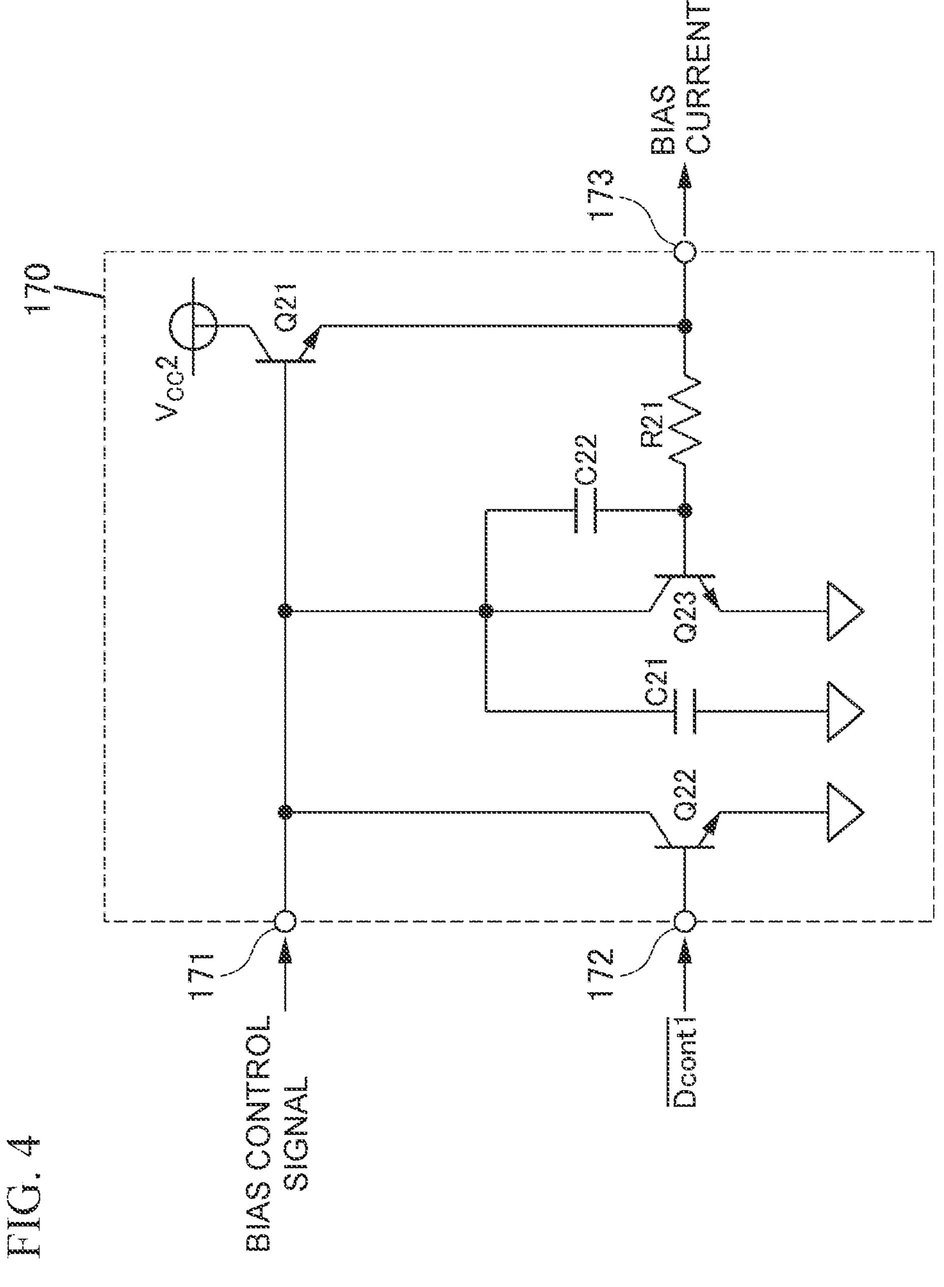
FIG. 4 is a diagram illustrating an example of the configuration of a carrier control circuit according to the first embodiment.

The carrier control circuit 170 is, for example, a circuit that controls the bias point of a certain carrier amplifier in the carrier circuit 120. The certain carrier amplifier is desirably, for example, a carrier amplifier at the input side when the carrier circuit 120 is composed of multiple carrier amplifiers. The certain carrier amplifier is hereinafter described as the buffer amplifier 121 at the input side for convenience. A configuration of the carrier control circuit 170 will now be described with reference to FIG. 4. FIG. 4 is a diagram illustrating an example of the configuration of the carrier control circuit 170 according to the first embodiment. As illustrated in FIG. 4, the carrier control circuit 170 includes, for example, a bias control terminal 171, a signal input terminal 172, a bias output terminal 173, a transistor Q21, a transistor Q22, a transistor Q23, a resistor R21, a capacitor C21, and a capacitor C22. The bias control terminal 171 is a terminal to which current for determining the bias point with no input is supplied from an external circuit. The signal input terminal 172 is a terminal through which a signal resulting from inversion of the signal Dcont1 output from the carrier output circuit 160 is input. The bias output terminal 173 is, for example, a terminal that is connected to the base of the buffer amplifier 121 and that supplies the bias current to the base of the buffer amplifier 121. The transistor Q21 is a transistor that supplies the bias current to the buffer amplifier 121. For example, the collector of the transistor Q21 is connected to a power supply Vcc2 and the emitter thereof is connected to the base of the buffer amplifier 121 via the bias output terminal 173. The base of the transistor Q21 is connected to the bias control terminal 171. The collector of the transistor Q22 is connected to the base of the transistor Q21, the base thereof is connected to the signal input terminal 172, and the emitter thereof is grounded. Specifically, in the transistor Q21, the base current of the transistor Q21 is adjusted in accordance with the signal Dcont1 input through the signal input terminal 172. The resistor R21, the transistor Q23, the capacitor C21, and the capacitor C22 form a feedback circuit in the relationship with the transistor Q21. The capacitor C21 is a capacitor for removing a radio-frequency (RF) signal input into the transistor Q21. The capacitor C22 is connected to the collector of the transistor Q23 to inhibit the RF signal from entering the collector of the transistor Q23. The capacitance of the capacitor C21 may be increased to remove the capacitor C22. In addition, the resistor R21, the transistor Q23, the capacitor C21, and the capacitor C22 are not necessarily be provided and are not limited to the configuration illustrated in FIG. 4.

In the power amplifier module 100 according to the first embodiment, the voltage of the signal Dcont1 is decreased if the carrier output circuit 160 detects the saturation of the output amplifier 123, as illustrated in FIG. 3. Here, for example, the signal resulting from inversion of the signal Dcont1 is input into the signal input terminal 172 of the carrier control circuit 170. The inversion circuit may be realized by a NOT circuit or an inversion circuit formed of a transistor.

<<Modifications>>

Figure 5:
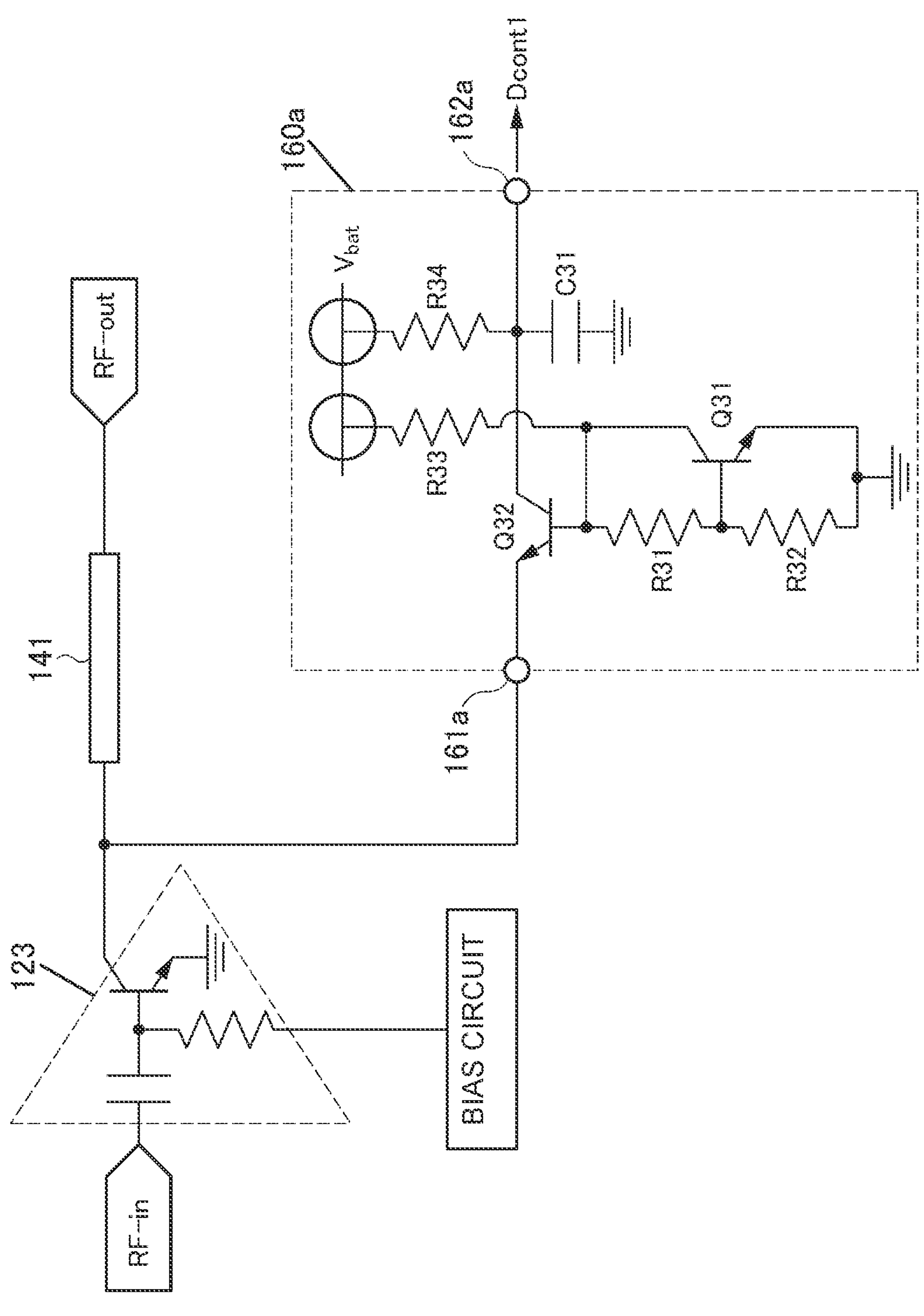
FIG. 5 is a diagram illustrating an example of the configuration of a carrier output circuit according to a first modification.

A first modification of the carrier output circuit 160 will now be described with reference to FIG. 5. FIG. 5 is a diagram illustrating an example of the configuration of a carrier output circuit 160*a* according to the first modification. When the field effect transistor is used instead of the bipolar transistor in the output amplifier 123 in FIG. 5, the collector of the output amplifier 123 is replaced with the drain of the output amplifier 123. As illustrated in FIG. 5, the carrier output circuit 160*a* detects the amplitude of voltage of the collector of the output amplifier 123. The carrier output circuit 160*a* outputs the signal Dcont1 indicating that the output amplifier 123 is saturated based on the amplitude of the voltage of the collector. As illustrated in FIG. 5, the carrier output circuit 160*a* includes, for example, an input terminal 161*a*, an output terminal 162*a*, a transistor Q31, a transistor Q32, a resistor R31, a resistor R32, a resistor R33, a resistor R34, and a capacitor C31. The input terminal 161*a* is a terminal through which the voltage of the collector of the output amplifier 123 is input. The output terminal 162*a* is a terminal through which the signal Dcont1 is output. The collector of the transistor Q31 is connected to a power supply Vbat via the resistor R33, the base thereof is connected to a node between the resistor R31 and the resistor R32, and the emitter thereof is grounded. The base of the transistor Q31 is connected to the base of the transistor Q32 via the resistor R31, and the collector of the transistor Q31 is connected to the base of the transistor Q32. In other words, the transistor Q31, the resistor R31, and the resistor R32 form a constant voltage circuit. Accordingly, the base potential of the transistor Q32 is kept constant by the constant voltage circuit. The base of the transistor Q32 is connected to the constant voltage circuit, the collector thereof is connected to the power supply Vbat via the resistor R34, and the emitter thereof is connected to the input terminal 161*a*. The collector of the transistor Q32 is connected to the output terminal 162*a*. The capacitor C31 is a capacitor for smoothing the signal Dcont1. One end of the capacitor C31 is connected to a node between the collector of the transistor Q32 and the output terminal 162*a* and the other end thereof is grounded.

Figure 6:
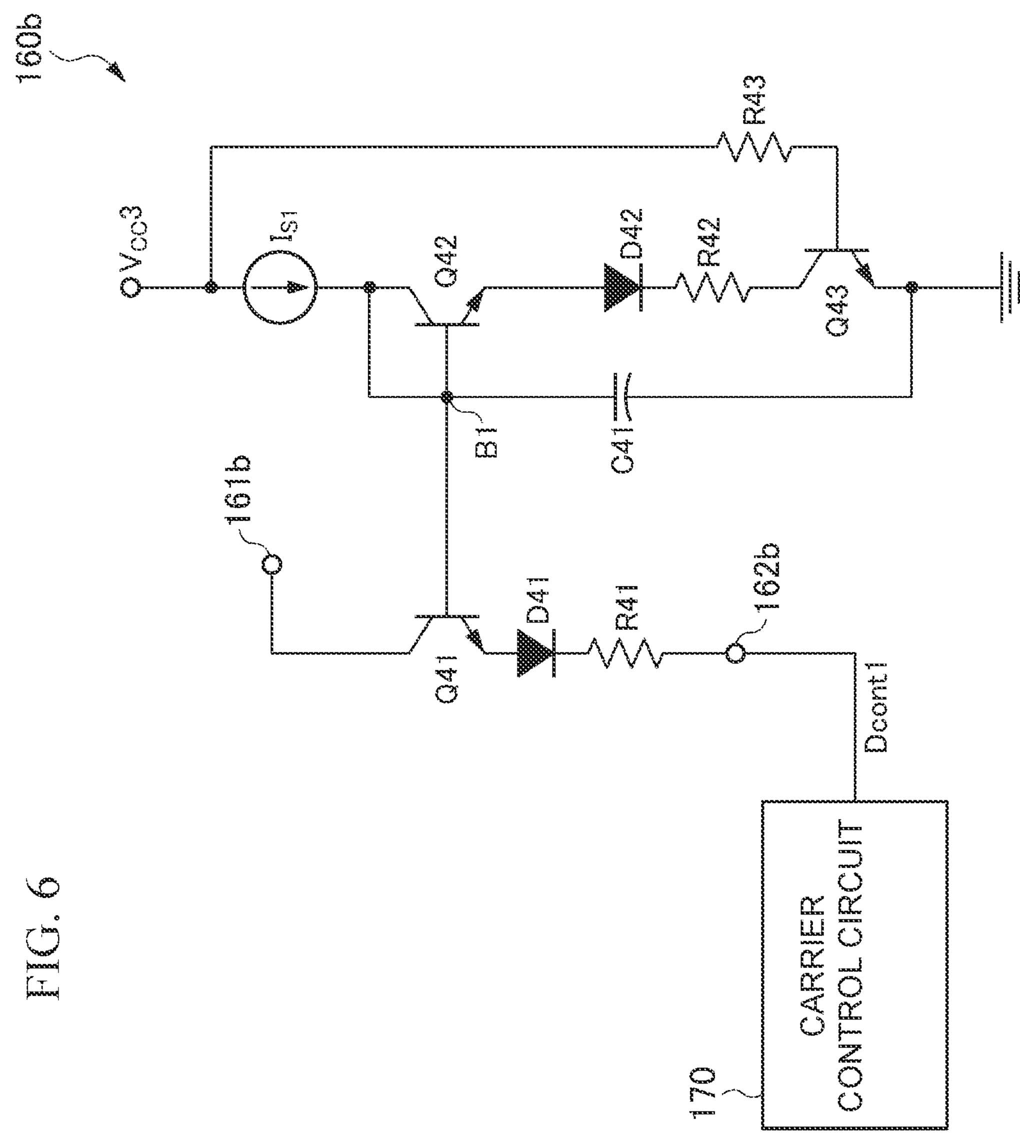
FIG. 6 is a diagram illustrating an example of the configuration of a carrier output circuit according to a second modification.

A second modification of the carrier output circuit 160 will now be described with reference to FIG. 6. FIG. 6 is a diagram illustrating an example of the configuration of a carrier output circuit 160*b* according to the second modification. As illustrated in FIG. 6, the carrier output circuit 160*b* includes, for example, an input terminal 161*b*, an output terminal 162*b*, a transistor Q41, a transistor Q42, a transistor Q43, a diode D41, a diode D42, a resistor R41, a resistor R42, a resistor R43, a capacitor C41, and a current source Is1. The input terminal 161*b* is a terminal through which the voltage of the collector of the output amplifier 123 is input. The output terminal 162*b* is a terminal through which the signal Dcont1 is output. The collector of the transistor Q41 is connected to the input terminal 161*b*, the emitter thereof is connected to the anode of the diode D41, and the base thereof is connected to certain reference potential B1. The cathode of the diode D41 is connected to the output terminal 162*b* via the resistor R41. The collector of the transistor Q42 is connected to a power supply Vcc3 via the current source Is1, the emitter thereof is connected to the anode of the diode D42, and the base thereof is connected to the certain reference potential B1. The collector of the transistor Q43 is connected to the cathode of the diode D42 via the resistor R42, the emitter thereof is grounded, and the base thereof is connected to the power supply Vcc3 via the resistor R43. One end of the capacitor C41 is connected to the certain reference potential B1 and the other end thereof is grounded. The diodes D41 and D42 may be realized by diode-connected transistors.

Figure 7:
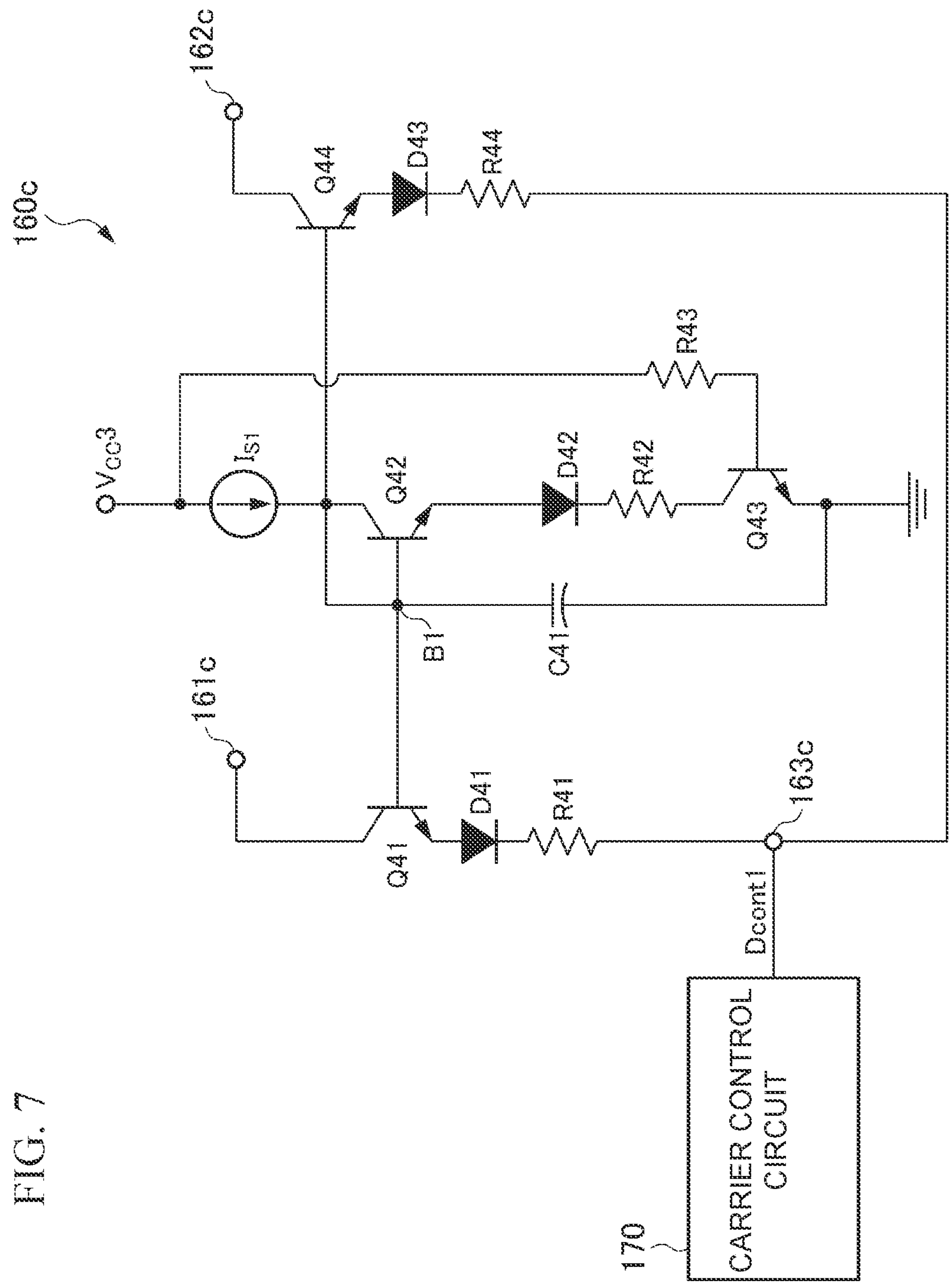
FIG. 7 is a diagram illustrating an example of the configuration of a carrier output circuit according to a third modification.

A third modification of the carrier output circuit 160 will now be described with reference to FIG. 7. FIG. 7 is a diagram illustrating an example of the configuration of a carrier output circuit 160*c* according to the third modification. A description of points common to the carrier output circuit 160*b* according to the second modification described above is omitted herein and only points different from the carrier output circuit 160*b* according to the second modification are described. As illustrated in FIG. 7, the carrier output circuit 160*c* is a circuit resulting from addition of an input terminal 162*c*, a transistor Q44, a diode D43, and a resistor R44 to the carrier output circuit 160*b* according to the second modification. The input terminal 162*c* is a terminal through which the voltage of the collector of the output amplifier 133 in the peak circuit 130 is input. The collector of the transistor Q44 is connected to the input terminal 162*c*, the emitter thereof is connected to the anode of the diode D43, and the base thereof is connected to the certain reference potential B1. The cathode of the diode D43 is connected to the output terminal 163*c* via the resistor R44.

The carrier output circuits 160*a* to 160*c* illustrated in FIG. 5 to FIG. 7, respectively, output the signal Dcont1 the voltage of which is increased when the saturation of the output amplifier 123 is detected. Accordingly, since it is optional to invert the voltage to be input into the signal input terminal 172 of the carrier control circuit 170, the simple circuit configuration is realized.

===Operation of Power Amplifier Module 100===

An operation of the power amplifier module 100 will now be described with reference to FIG. 1 to FIG. 5. First, when the output amplifier 123 is saturated in the power amplifier module 100, a base-collector diode of the output amplifier 123 is in an on state. This increases the base current of the output amplifier 123, as illustrated in FIG. 3, to increase the emitter current of the transistor Q11 in the carrier output circuit 160 illustrated in FIG. 2 and to increase the base current of the transistor Q11. Since this decreases the collector current of the transistor Q12, the base current of the transistor Q12 is also decreased. Accordingly, the base potential of the transistor Q12 is decreased to decrease the signal Dcont1. Consequently, the carrier output circuit 160 is capable of outputting the signal Dcont1 based on the base current of the output amplifier 123.

Next, for example, the signal Dcont1 that is inverted is input into the carrier control circuit 170 illustrated in FIG. 4 through the signal input terminal 172. Upon input of the inverted signal Dcont1 into the base of the transistor Q22, the transistor Q22 is turned on. Since the current supplied to the base of the transistor Q21 flows through the transistor Q22 upon tuning-on of the transistor Q22, the base current of the transistor Q21 is decreased. In other words, the base current of the buffer amplifier 121, which is supplied from the bias output terminal 173 connected to the emitter of the transistor Q21, is decreased. Since this decreases the bias point of the buffer amplifier 121, the saturation state of the output amplifier 123 is relieved to prevent the damage of the power amplifier module 100.

===Power Amplifier Module 200 According to Second Embodiment===

Figure 8:
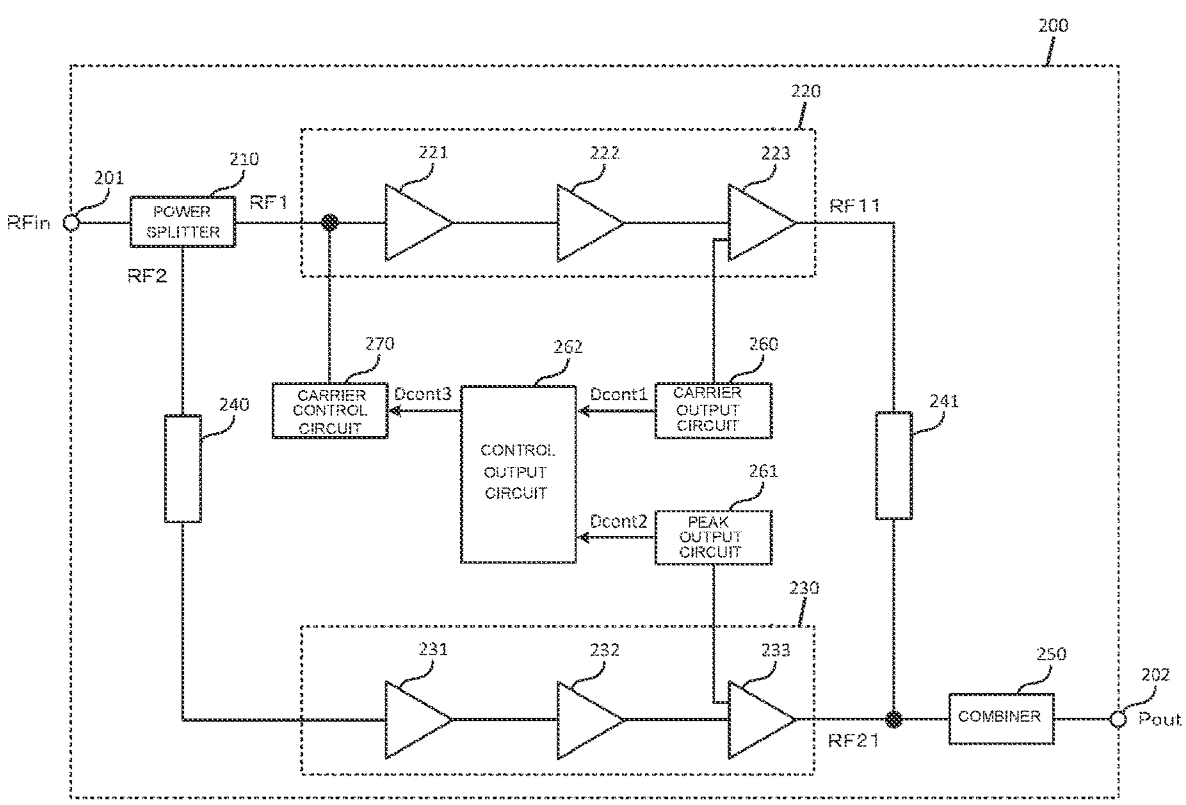
FIG. 8 is a diagram illustrating an example of the configuration of a power amplifier module according to a second embodiment.
Figure 9:
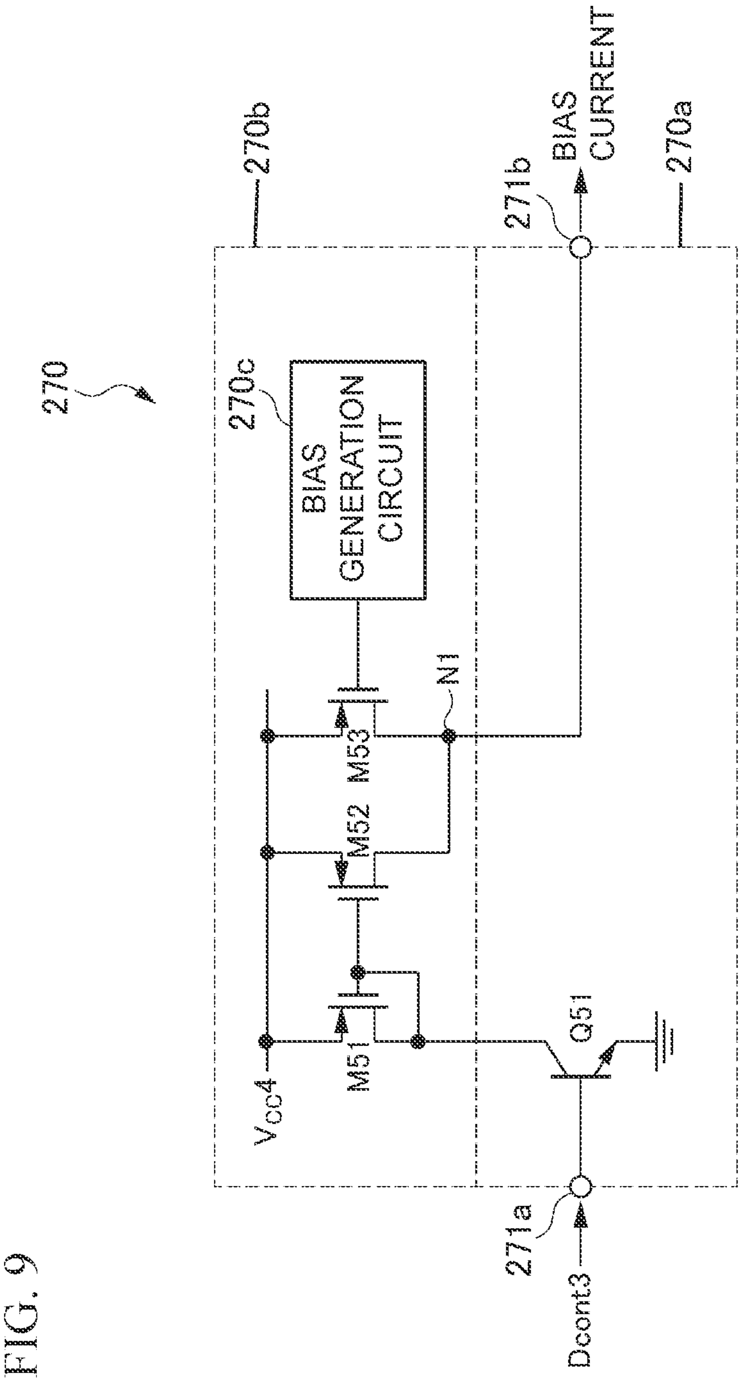
FIG. 9 is a diagram illustrating an example of the configuration of a carrier control circuit according to the second embodiment.

A power amplifier module 200 according to a second embodiment will now be described with reference to FIG. 8 and FIG. 9. FIG. 8 is a diagram illustrating an example of the configuration of the power amplifier module 200 according to the second embodiment. FIG. 9 is a diagram illustrating an example of the configuration of a carrier control circuit 270 according to the second embodiment. A description of components common to the power amplifier module 100 according to the first embodiment, among the components of the power amplifier module 200 according to the second embodiment, is omitted herein and only points different from the power amplifier module 100 according to the first embodiment are described. In addition, the same advantages and effects of the same components are not successively described.

The power amplifier module 200 increases the bias point of the carrier amplifier before the load impedance of the carrier amplifier is decreased, against reduction in gain caused by reduction in the load impedance of the carrier amplifier when the carrier amplifier is saturated and the peak amplifier operates, to suppress the reduction in the gain.

As illustrated in FIG. 8, the power amplifier module 200 includes, for example, an input terminal 201, an output terminal 202, a power splitter 210, a carrier circuit 220, a peak circuit 230, a peak phase shifter 240, a carrier phase shifter 241, a combiner 250, a carrier output circuit 260, a peak output circuit 261, a control output circuit 262, and a carrier control circuit 270. Since the input terminal 201, the output terminal 202, the power splitter 210, the carrier circuit 220, the peak circuit 230, the peak phase shifter 240, the carrier phase shifter 241, the combiner 250, and the carrier output circuit 260 are the same as the input terminal 101, the output terminal 102, the power splitter 110, the carrier circuit 120, the peak circuit 130, the peak phase shifter 140, the carrier phase shifter 141, the combiner 150, and the carrier output circuit 160, a description of the input terminal 201, the output terminal 202, the power splitter 210, the carrier circuit 220, the peak circuit 230, the peak phase shifter 240, the carrier phase shifter 241, the combiner 250, and the carrier output circuit 260 is omitted herein.

The peak output circuit 261 supplies, for example, the bias current to an output amplifier 233 in the peak circuit 230 and detects the base current of the output amplifier 233. The peak output circuit 261 outputs a signal (hereinafter referred to as a "signal Dcont2") indicating that the output amplifier 233 is saturated based on the base current of the output amplifier 233. Since the same configuration as that of the carrier output circuit 160 is capable of being used for the peak output circuit 261, a description of the configuration of the peak output circuit 261 is omitted herein.

The control output circuit 262 supplies a signal (hereinafter referred to as a "signal Dcont3") for controlling the bias point of a buffer amplifier 221 in the carrier circuit 220 to the carrier control circuit 270, for example, based on the signal Dcont1 output from the carrier output circuit 260 and the signal Dcont2 output from the peak output circuit 261. The control output circuit 262 may be composed of, for example, an analog circuit including a differential amplifier or may be configured so as to convert the signal Dcont1 and the signal Dcont2 into digital signals and convert the digital signals into the analog signals again. For example, when the signal Dcont1 and the signal Dcont2 are converted into the digital signals, the control output circuit 262 may generate the signal Dcont3 in consideration of an envelope signal of the signal RFin, the history of the signal RFin, the ambient temperature, and so on.

The carrier control circuit 270 is, for example, a circuit that controls the bias point of a certain carrier amplifier in the carrier circuit 220. The certain carrier amplifier is desirably, for example, the buffer amplifier 221 at the input side when the carrier circuit 220 is composed of multiple carrier amplifiers. The certain carrier amplifier is hereinafter described as the buffer amplifier 221 for convenience. A configuration of the carrier control circuit 270 will now be described with reference to FIG. 9. FIG. 9 is a diagram illustrating an example of the configuration of the carrier control circuit 270. As illustrated in FIG. 9, the carrier control circuit 270 includes, for example, a switching circuit 270*a* and a current adding circuit 270*b*.

The switching circuit 270*a* includes, for example, an input terminal 271*a*, an output terminal 271*b*, and a transistor Q51. The input terminal 271*a* is a terminal through which the signal Dcont3 output from the control output circuit 262 is input. The output terminal 271*b* is a terminal that is connected to the base of the buffer amplifier 221 and that supplies the bias current. The base of the transistor Q51 is connected to the input terminal 271*a*, the collector thereof is connected to the current adding circuit 270*b*, and the emitter thereof is grounded.

The current adding circuit 270*b* includes, for example, a field effect transistor M51, a field effect transistor M52, a field effect transistor M53, and a bias generation circuit 270*c*. The field effect transistor M51 and the field effect transistor M52 form a current mirror circuit. The source of the field effect transistor M51 is connected to the collector of the transistor Q51, the source of the field effect transistor M51 is connected to the gate thereof, and the drain of the field effect transistor M51 is connected to a power supply Vcc4. The source of the field effect transistor M52 is connected to the source of the field effect transistor M53 and the drain thereof is connected to the power supply Vcc4. The source of the field effect transistor M53 is connected to the output terminal 271*b*, the gate thereof is connected to the bias generation circuit 270*c*, and the drain thereof is connected to the power supply Vcc4.

An operation of the power amplifier module 200 will now be described with reference to FIG. 8 and FIG. 9. First, when the output amplifier 223 in the carrier circuit 220 is saturated in the power amplifier module 200, a base-collector diode of the output amplifier 223 is in the on state. This increases the base current of the output amplifier 223. The carrier output circuit 260 detects the increased base current to supply the signal Dcont1 to the control output circuit 262. Similarly, when the output amplifier 233 in the peak circuit 230 is saturated, a base-collector diode of the output amplifier 233 is in the on state. This increases the base current of the output amplifier 233. The peak output circuit 261 detects the base current of the output amplifier 233 to supply the signal Dcont2 to the control output circuit 262. The control output circuit 262 supplies the signal Dcont3 to the carrier control circuit 270 based on the signal Dcont1 and the signal Dcont2. Upon input of the signal Dcont3 into the input terminal 271*a* in the carrier control circuit 270, the transistor Q51 is turned on. When the current flows through the collector of the transistor Q51, the current flows through the field effect transistor M51 and the field effect transistor M52, which form the current mirror circuit. As a result, the current is applied to a node N1 to which the source of the field effect transistor M52 is connected. In the carrier control circuit 270, the bias current flows through the field effect transistor M53 from the bias generation circuit 270*c* before the signal Dcont3 is input. In other words, the carrier control circuit 270 adds the current flowing through the node N1 to the bias current in response to the input of the signal Dcont3. The carrier control circuit 270 supplies the bias current to the base of the buffer amplifier 221 via the output terminal 271*b*. Accordingly, the power amplifier module 200 increases the bias point of the output amplifier 223 before the load impedance of the output amplifier 223 is decreased to suppress the reduction in the gain.

<<First Modification>>

Figure 10:
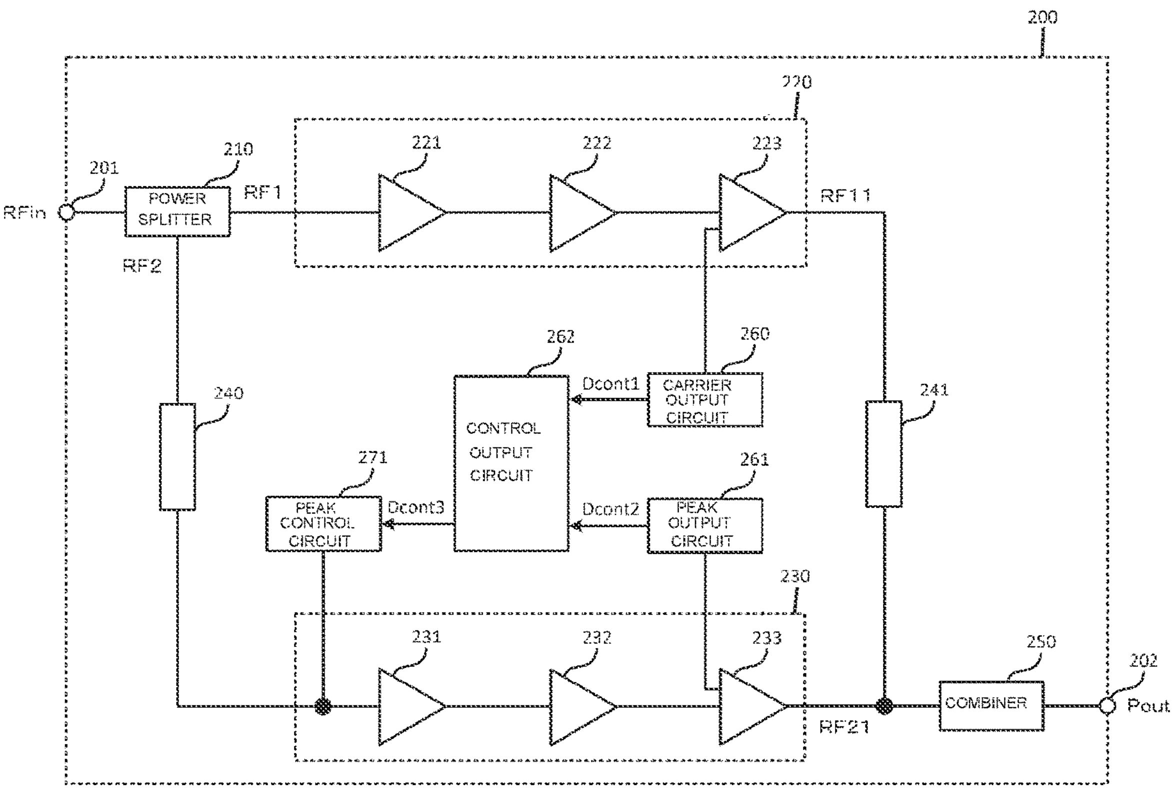
FIG. 10 is a diagram illustrating a configuration of a first modification of the power amplifier module according to the second embodiment.

A first modification of the power amplifier module 200 will now be described with reference to FIG. 10. FIG. 10 is a diagram illustrating a configuration of the first modification of the power amplifier module 200 according to the second embodiment. A description of points common to the above embodiment is omitted and only points different from the above embodiment are described in the present modification. In particular, the same advantages and effects of the same components are not successively described.

The power amplifier module 200 according to the first modification increases the bias point of the buffer amplifier 231 when the output amplifier 223 in the carrier circuit 220 comes close to the saturation. In addition, the power amplifier module 200 decreases the bias point of the buffer amplifier 231 when the output amplifier 233 in the peak circuit 230 comes close to the saturation. Accordingly, for example, if the output amplifier 233 in the peak circuit 230 is saturated in a state in which the output amplifier 223 in the carrier circuit 220 is not saturated due to an external factor, it is possible to suppress the failure of the peak circuit 230 due to further input of power into the output amplifier 233.

A peak control circuit 271 is provided, instead of the carrier control circuit 270, in the power amplifier module 200 according to the first modification. The peak control circuit 271 is, for example, a circuit that controls the bias point of a certain peak amplifier in the peak circuit 230. The certain peak amplifier is desirably, for example, a peak amplifier at the input side (the buffer amplifier 231 here) when the peak circuit 230 is composed of multiple peak amplifiers. Since the configuration of the peak control circuit 271 is, for example, the same as the configuration of the carrier control circuit 270, a description of the configuration of the peak control circuit 271 is omitted herein.

<<Second Modification>>

Figure 11:
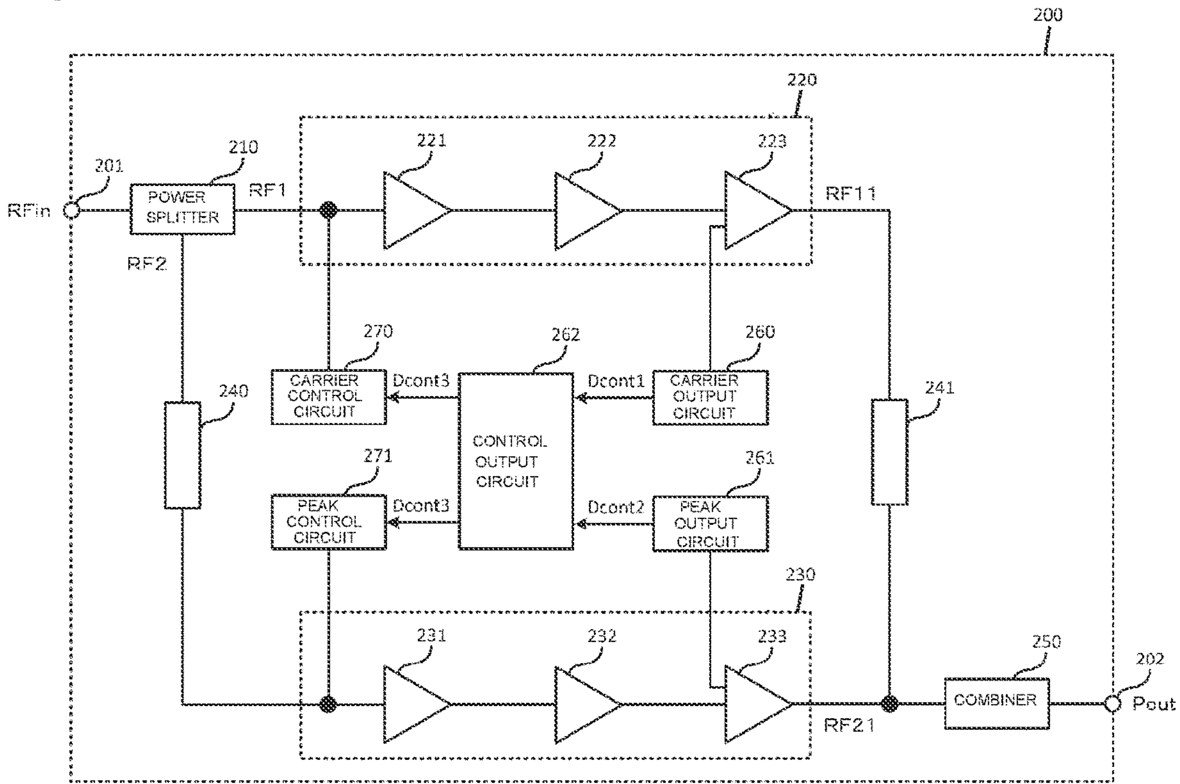
FIG. 11 is a diagram illustrating a configuration of a second modification of the power amplifier module according to the second embodiment.

A second modification of the power amplifier module 200 will now be described with reference to FIG. 11. FIG. 11 is a diagram illustrating a configuration of the second modification of the power amplifier module 200 according to the second embodiment. A description of points common to the above embodiment is omitted and only points different from the above embodiment are described in the present modification. In particular, the same advantages and effects of the same components are not successively described.

The power amplifier module 200 according to the second modification increases the bias point of the buffer amplifier 221 in the carrier circuit 220 when the output amplifier 233 in the peak circuit 230 comes close to the saturation and increases the bias point of the buffer amplifier 231 in the peak circuit 230 when the output amplifier 223 in the carrier circuit 220 comes close to the saturation. In addition, the power amplifier module 200 decreases the bias point of the buffer amplifier 231 in the peak circuit 230 when the output amplifier 233 in the peak circuit 230 comes close to the saturation. Accordingly, the power amplifier module 200 is capable of increasing the bias point of the output amplifier 223 before the load impedance of the output amplifier 223 in the carrier circuit 220 is decreased to suppress the reduction in the gain. In addition, if the output amplifier 233 is saturated in a state in which the output amplifier 223 is not saturated due to an external factor, it is possible to suppress the failure of the peak circuit 230 due to further input of power into the output amplifier 233. The carrier control circuit 270 and the peak control circuit 271 are provided in the power amplifier module 200 according to the second modification. Since the configurations of the carrier control circuit 270 and the peak control circuit 271 are described above, a description of the configurations of the carrier control circuit 270 and the peak control circuit 271 is omitted herein.

===Power Amplifier Module 300 According to Third Embodiment===

Figure 12:
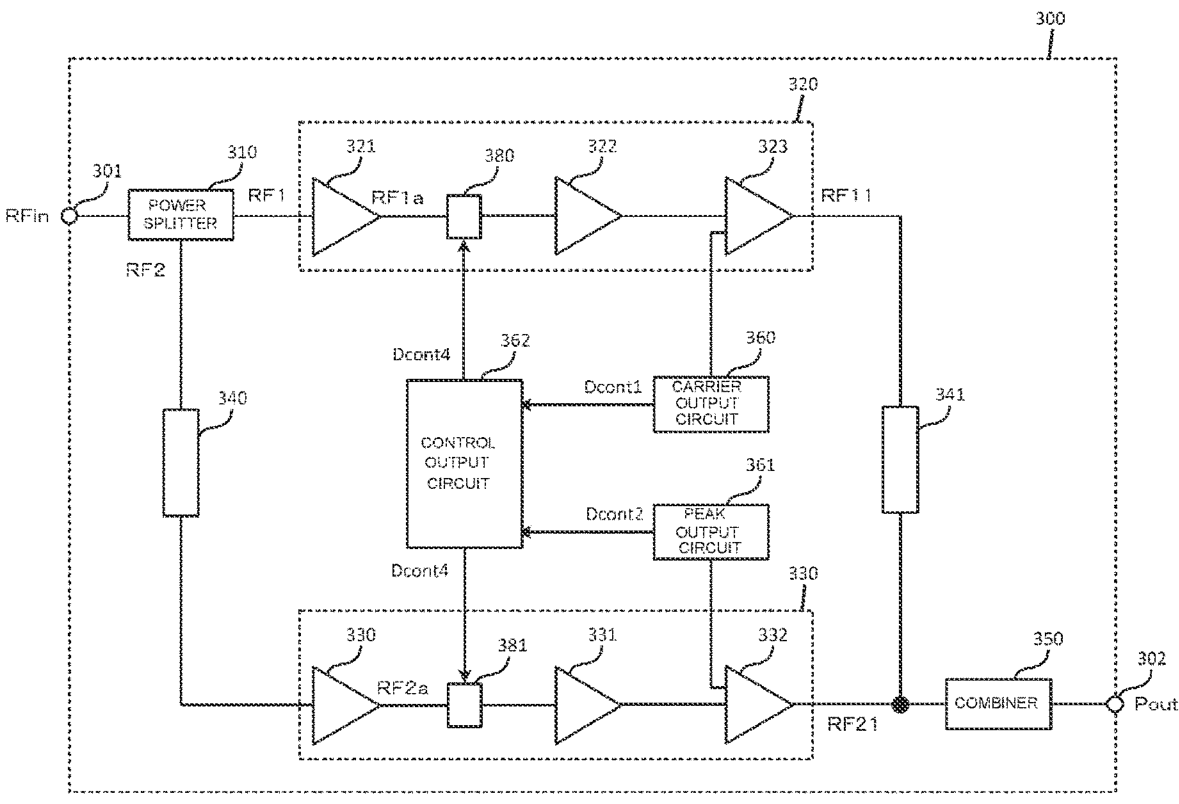
FIG. 12 is a diagram illustrating an example of the configuration of a power amplifier module according to a third embodiment.

A power amplifier module 300 according to a third embodiment will now be described with reference to FIG. 12. FIG. 12 is a diagram illustrating an example of the configuration of the power amplifier module 300 according to the third embodiment. A description of components common to the power amplifier modules 100 and 200 according to the first embodiment and the second embodiment, among the components of the power amplifier module 300 according to the third embodiment, is omitted herein and only points different from the power amplifier modules 100 and 200 according to the first embodiment and the second embodiment are described. In addition, the same advantages and effects of the same components are not successively described.

The power amplifier module 300 controls bandpass characteristics of at least one of a carrier circuit 320 and a peak circuit 330 to control the saturation state of at least one of an output amplifier 323 and an output amplifier 333. Since the saturation state of at least one of the carrier amplifier at the output side and the peak amplifier at the output side is relieved in the power amplifier module 300, it is possible to prevent the damage of the power amplifier module 300, which is caused by the saturation of the carrier amplifier or the peak amplifier.

The power amplifier module 300 includes a control output circuit 362, a carrier control circuit 380, and a peak control circuit 381. It is sufficient for the power amplifier module 300 to include at least one of the carrier control circuit 380 and the peak control circuit 381.

The control output circuit 362 outputs a signal (hereinafter referred to as a "signal Dcont4") for controlling the bandpass characteristics of at least one of the carrier control circuit 380 and the peak control circuit 381, for example, based on the signal Dcont1 output from a carrier output circuit 360 and the signal Dcont2 output from a peak output circuit 361. The control output circuit 362 may be composed of, for example, an analog circuit including a differential amplifier or may be configured so as to convert the signal Dcont1 and the signal Dcont2 into digital signals and convert the digital signals into the analog signals again. For example, when the signal Dcont1 and the signal Dcont2 are converted into the digital signals, the control output circuit 362 may generate the signal Dcont4 in consideration of an envelope signal of the signal RFin, the history of the signal RFin, the ambient temperature, and so on.

The carrier control circuit 380 may be, for example, a variable attenuator that varies the characteristics when the current to be supplied to the base of a certain carrier amplifier passes. The carrier control circuit 380 is, for example, connected in series between a buffer amplifier 321 and a driver amplifier 322. The carrier control circuit 380 is not limited to the series connection between the buffer amplifier 321 and the driver amplifier 322. The carrier control circuit 380 may be connected in series between the driver amplifier 322 and the output amplifier 323 or may be connected in series to the input side of the buffer amplifier 321.

The peak control circuit 381 may be, for example, a variable attenuator that varies the characteristics when the current to be supplied to the base of a certain peak amplifier passes. The peak control circuit 381 is, for example, connected in series between a buffer amplifier 331 and a driver amplifier 332. The peak control circuit 381 is not limited to the series connection between the buffer amplifier 331 and the driver amplifier 332. The peak control circuit 381 may be connected in series between the driver amplifier 332 and the output amplifier 333 or may be connected in series to the input side of the buffer amplifier 331.

Figure 13:
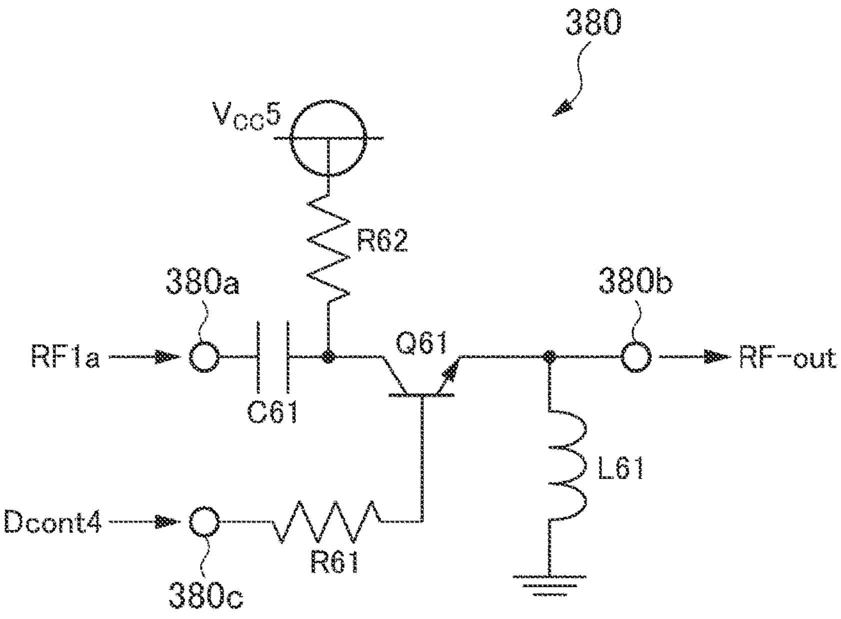
FIG. 13 is a diagram illustrating an example of the configuration of a carrier control circuit according to the third embodiment.

An example of the configuration of the carrier control circuit 380 will now be described with reference to FIG. 13. FIG. 13 is a diagram illustrating an example of the configuration of the carrier control circuit 380 according to the third embodiment. Since the peak control circuit 381 has the same configuration as that of the carrier control circuit 380, a description of the configuration of the peak control circuit 381 is omitted herein. The carrier control circuit 380 controls passing of a signal RF1*a* output from the buffer amplifier 321, for example, based on the signal Dcont4. In other words, the carrier control circuit 380 varies the bandpass characteristics for the signal RF1*a*, for example, based on the signal Dcont4. Accordingly, the carrier control circuit 380 is capable of easily controlling the operation of the output amplifier 323. As illustrated in FIG. 13, the carrier control circuit 380 includes, for example, an input terminal 380*a*, an output terminal 380*b*, a control terminal 380*c*, a transistor Q61, a resistor R61, a resistor R62, a capacitor C61, and an inductor L61. The input terminal 380*a* is a terminal to which the signal RF1*a* is supplied. A signal RF from the emitter of the transistor Q61 is output through the output terminal 380*b* in response to the signal Dcont4. The control terminal 380*c* is a terminal to which the signal Dcont4 is supplied. The collector of the transistor Q61 is connected to the input terminal 380*a* via the capacitor C61, the emitter thereof is connected to the output terminal 380*b*, and the base thereof is connected to the control terminal 380*c* via the resistor R61. The collector of the transistor Q61 is connected to a power supply Vcc5 via the resistor R62. The capacitor C61 is a capacitor for cutting a direct-current component of the signal RF1*a*. One end of the inductor L61 is connected to the emitter of the transistor Q61 and the other end thereof is grounded. The inductor L61 is an inductor for feeding the direct-current component of the signal RF1*a* to the ground. Although the output of the control output circuit 362 illustrated in FIG. 12 is directly connected to the control terminal 380*c* illustrated in FIG. 13, a level shift circuit may be appropriately provided. Although the transistor Q61 illustrated in FIG. 13 is described as a bipolar transistor, the transistor Q61 may be a field effect transistor.

The carrier control circuit 380 is not limited to the variable attenuator described above. The carrier control circuit 380 may be a switch for switching passing of the signal RF1*a* through the driver amplifier 322. The switch is, for example, connected in series to the base of the buffer amplifier 321. The switch is turned on upon input of the signal Dcont4 from the control output circuit 362. In other words, the switch performs the switching so as to pass the signal RF1*a* in the on state and not to pass the signal RF1*a* in the off state. Accordingly, the carrier control circuit 380 is capable of controlling the operating point of the output amplifier 323 with the simple configuration.

Figure 14:
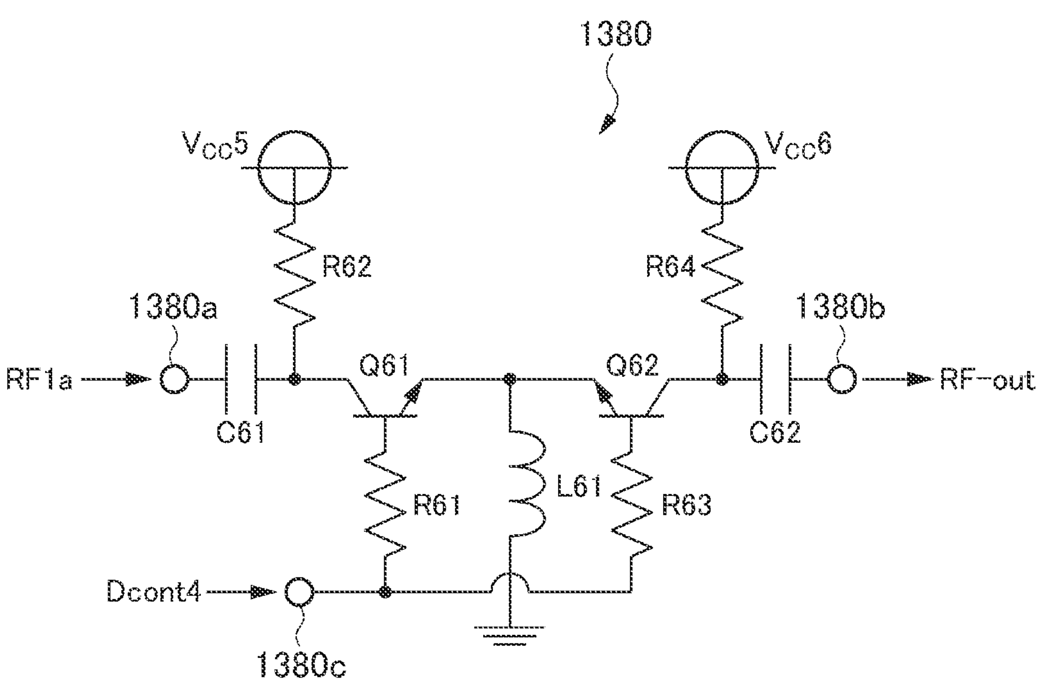
FIG. 14 is a diagram illustrating an example of the configuration of a carrier control circuit according to a first modification.

A first modification of the carrier control circuit 380 will now be described with reference to FIG. 14. FIG. 14 is a diagram illustrating an example of the configuration of a carrier control circuit 1380 according to the first modification. A description of points common to the carrier control circuit 380 described above is omitted and only points different from the carrier control circuit 380 are described. As illustrated in FIG. 14, the carrier control circuit 1380 is, for example, a circuit resulting from addition of a transistor Q62, a resistor R63, a resistor R64, and a capacitor C62 between an input terminal 1380*a* and an output terminal 1380*b* in the carrier control circuit 380. The collector of the transistor Q62 is connected to the output terminal 1380*b* via the capacitor C62, the emitter thereof is grounded via an inductor L61, and the base thereof is connected a control terminal 1380*c* via the resistor R63. The emitter of the transistor Q62 is connected to the emitter of the transistor Q61. The collector of the transistor Q62 is connected to a power supply Vcc6 via the resistor R64. Although the output of the control output circuit 362 illustrated in FIG. 12 is directly connected to the control terminal 1380*c* illustrated in FIG. 14, a level shift circuit may be appropriately provided. Although the transistor Q61 and the transistor Q62 illustrated in FIG. 14 are described as bipolar transistors, the transistor Q61 and the transistor Q62 may be field effect transistors.

Figure 15:
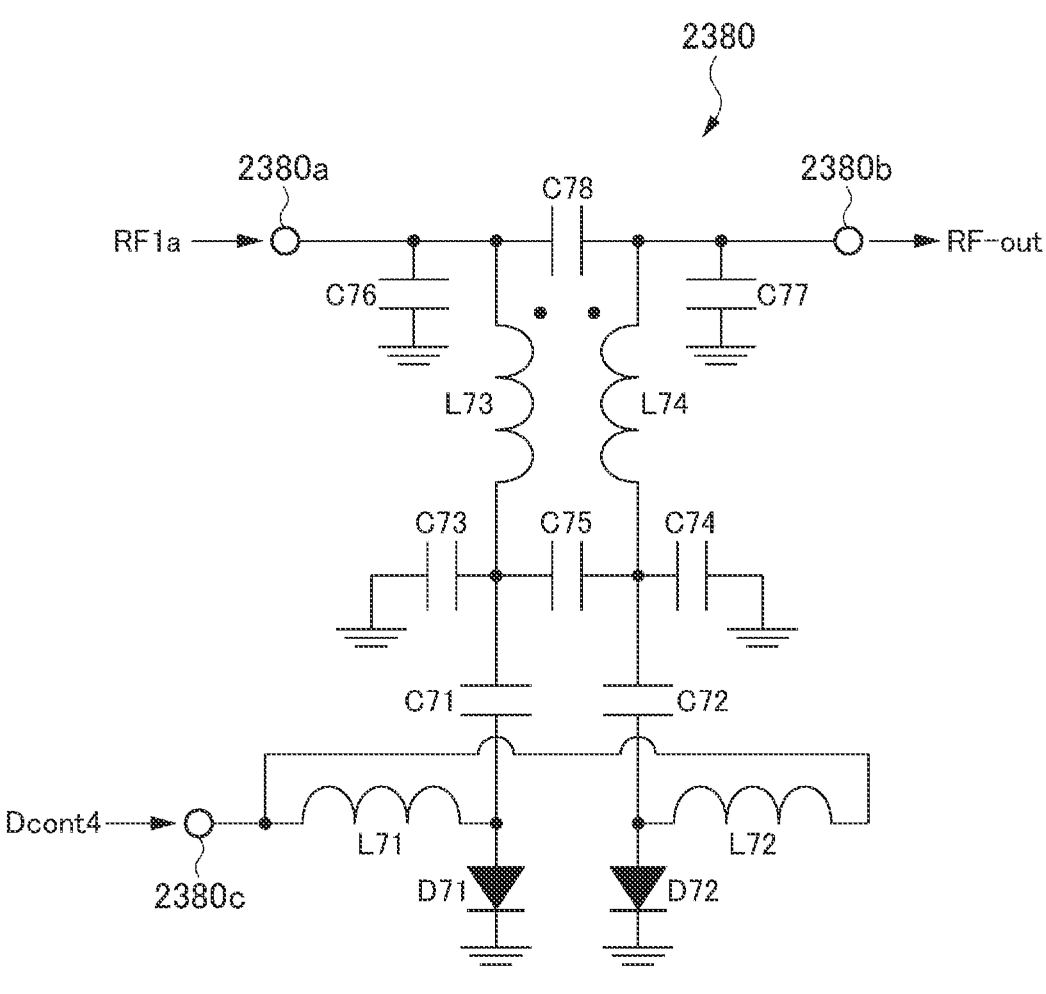
FIG. 15 is a diagram illustrating an example of the configuration of a carrier control circuit according to a second modification.

A second modification of the carrier control circuit 380 will now be described with reference to FIG. 15. FIG. 15 is a diagram illustrating an example of the configuration of a carrier control circuit 2380 according to the second modification. As illustrated in FIG. 15, the carrier control circuit 2380 includes, for example, an input terminal 2380*a*, an output terminal 2380*b*, a control terminal 2380*c*, a diode D71, a diode D72, an inductor L71, an inductor L72, a capacitor C71, a capacitor C72, inductors L73 and L74 composing a 90-degree hybrid circuit, and capacitors C73, C74, C75, C76, and C77. The input terminal 2380*a* is a terminal to which the signal RF1*a* is supplied. The output terminal 2380*b* is a terminal through which the signal RF corresponding to the signal Dcont4 is output. The control terminal 2380*c* is connected to the anode of the diode D71 via the inductor L71 and is connected to the anode of the diode D72 via the inductor L72. The cathodes of the diode D71 and the diode D72 are grounded. The capacitor C71 is a capacitor for cutting the direct-current component. One end of the capacitor C71 is connected to the anode of the diode D71 and the other end thereof is connected to the 90-degree hybrid circuit. The capacitor C72 is a capacitor for cutting the direct-current component. One end of the capacitor C72 is connected to the anode of the diode D72 and the other end thereof is connected to the 90-degree hybrid circuit. Although the output of the control output circuit 362 illustrated in FIG. 12 is directly connected to the control terminal 2380*c* illustrated in FIG. 15, a level shift circuit may be appropriately provided.

===Power Amplifier Module 400 According to Fourth Embodiment===

Figure 16:
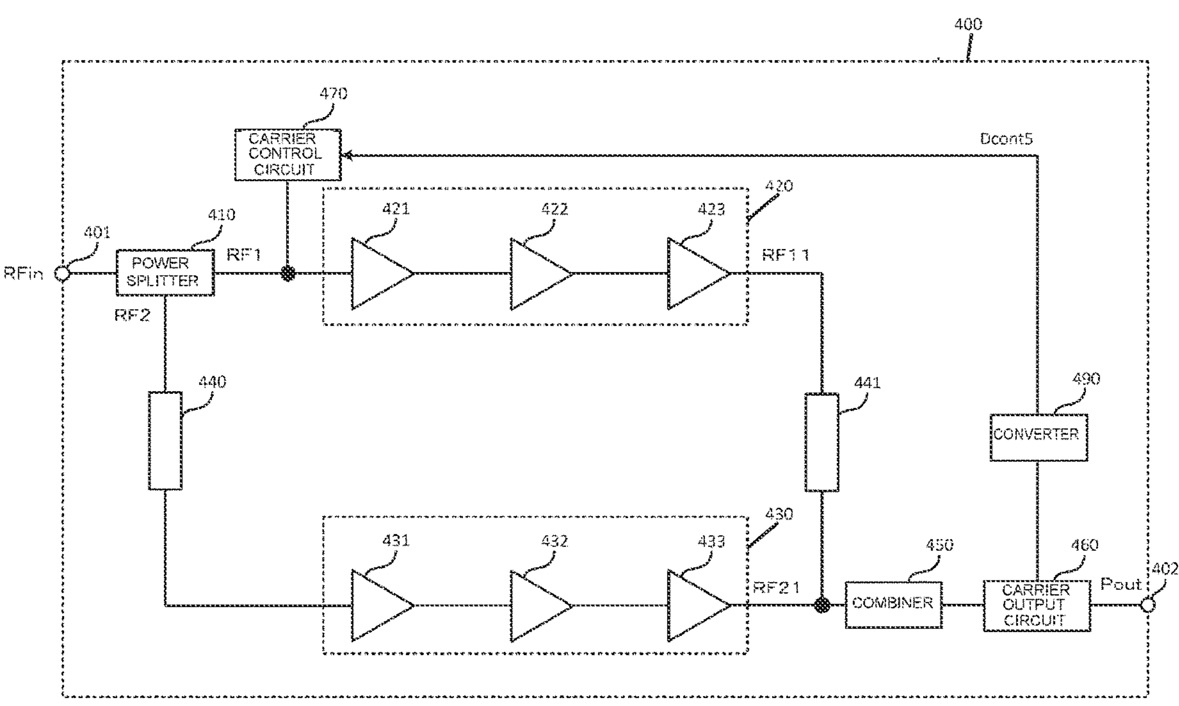
FIG. 16 is a diagram illustrating an example of the configuration of a power amplifier module according to a fourth embodiment.

A power amplifier module 400 according to a fourth embodiment will now be described with reference to FIG. 16. FIG. 16 is a diagram illustrating an example of the configuration of the power amplifier module 400 according to the fourth embodiment. A description of components common to the power amplifier modules 100, 200, and 300 according to the first embodiment, the second embodiment, and the third embodiment, among the components of the power amplifier module 400 according to the fourth embodiment, is omitted herein and only points different from the power amplifier modules 100, 200, and 300 according to the first embodiment, the second embodiment, and the third embodiment are described. In addition, the same advantages and effects of the same components are not successively described.

The power amplifier module 400 controls a buffer amplifier 421 in a carrier circuit 420 based on the frequency of a signal (hereinafter referred to as a "combined signal") output from a combiner 450. Since this relieves the saturation state of the carrier amplifier at the output side, it is possible to prevent the damage of the power amplifier module 400 due to the saturation of the carrier amplifier at the output side. The power amplifier module 400 includes a carrier output circuit 460, a carrier control circuit 470, and a converter 490.

The carrier output circuit 460 is, for example, configured so as to include a filter circuit (not illustrated) and supplies a signal for controlling the buffer amplifier 421 in the carrier circuit 420 to the converter 490 based on the frequency of the combined signal.

The converter 490 converts the signal supplied from the carrier output circuit 460 into direct current. The signal converted in the converter 490 is hereinafter described as a "signal Dcont5" for convenience.

Figure 17:
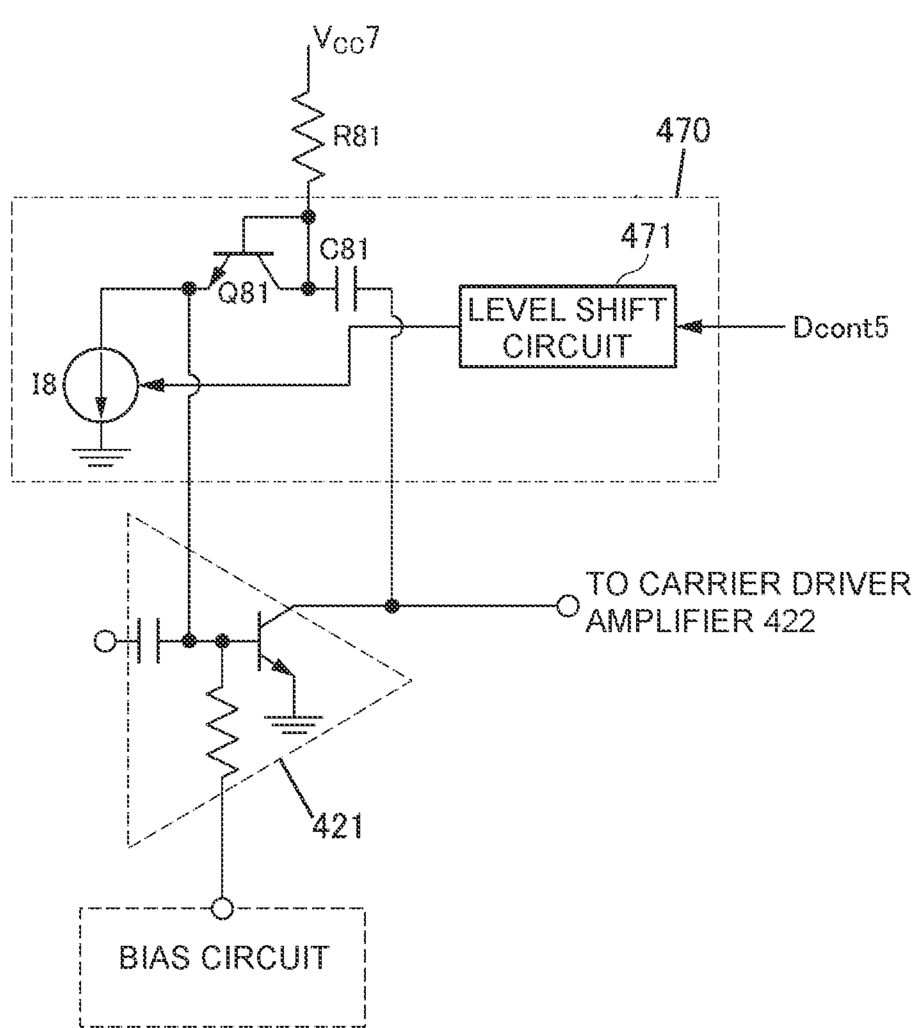
FIG. 17 is a diagram illustrating an example of the configuration of a carrier control circuit according to the fourth embodiment.

The carrier control circuit 470 is, for example, a circuit that controls the bias point of a certain carrier amplifier in the carrier circuit 420. The certain carrier amplifier is desirably, for example, the buffer amplifier 421 at the input side when the carrier circuit 420 is composed of multiple carrier amplifiers. The certain carrier amplifier is hereinafter described as the buffer amplifier 421 for convenience. A configuration of the carrier control circuit 470 will now be described with reference to FIG. 17. FIG. 17 is a diagram illustrating an example of the configuration of the carrier control circuit 470 according to the fourth embodiment. As illustrated in FIG. 17, the carrier control circuit 470 includes, for example, a level shift circuit 471, a transistor Q81, a current source 18, and a capacitor C81. The level shift circuit 471 is, for example, a circuit that increases the level of the direct-current signal Dcont5 that is input. The level shift circuit 471 supplies the signal Dcont5 the level of which is increased to the current source 18. The current source 18 feeds current based on the signal Dcont5 supplied from the level shift circuit 471. The transistor Q81 is, for example, a transistor serving as a variable resistor. The base of the transistor Q81 is connected to collector thereof, the collector of the transistor Q81 is connected to a power supply Vcc7 via a resistor R81 and is connected to the collector of the buffer amplifier 421 via the capacitor C81, and the emitter of the transistor Q81 is connected to the current source 18 and the base of the buffer amplifier 421. In the carrier control circuit 470, the current to be supplied to the base of the buffer amplifier 421 connected to the emitter of the transistor Q81 is decreased upon input of the signal Dcont5 into the current source 18. In other words, the carrier control circuit 470 is capable of controlling the base current of the buffer amplifier 421 based on the signal Dcont5.

Figure 18:
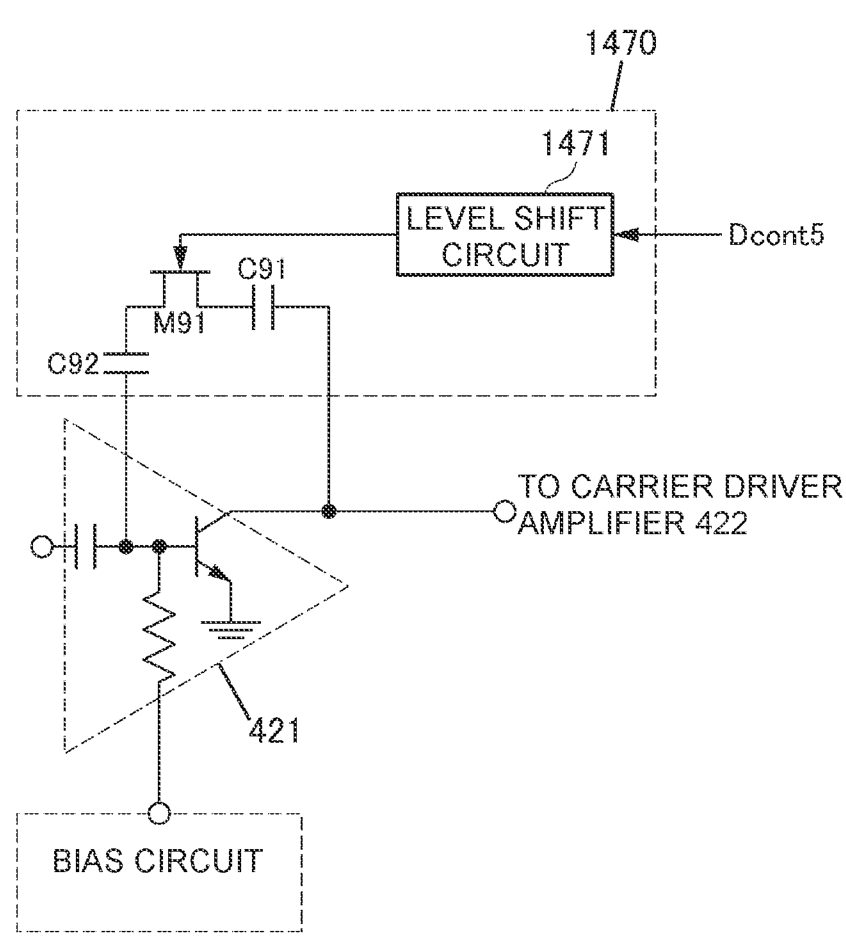
FIG. 18 is a diagram illustrating an example of the configuration of a carrier control circuit according to a first modification.

A modification of the configuration of the carrier control circuit 470 will now be described with reference to FIG. 18. FIG. 18 is a diagram illustrating an example of the configuration of a carrier control circuit 1470 of a first modification. As illustrated in FIG. 18, the carrier control circuit 1470 includes, for example, a level shift circuit 1471, a field effect transistor M91, a capacitor C91, and a capacitor C92. The level shift circuit 1471 supplies the signal Dcont5 the level of which is increased to the gate of the field effect transistor M91. The field effect transistor M91 is, for example, a transistor serving as a variable resistor. The gate of the field effect transistor M91 is connected to the level shift circuit 1471, the source thereof is connected to the base of the buffer amplifier 421 via the capacitor C92, and the drain thereof is connected to the collector of the buffer amplifier 421 via the capacitor C91.

===Review===

The power amplifier module 100 according to an exemplary embodiment of the disclosure includes the carrier circuit 120 including at least one carrier amplifier; the peak circuit 130 including at least one peak amplifier; the carrier control circuit 170, which controls the base current or the gate voltage of a certain carrier amplifier (for example, the buffer amplifier 121) in the carrier circuit 120; and the carrier output circuit 160, which is connected to a carrier amplifier at the output side (for example, the output amplifier 123) in the carrier circuit 120 and which supplies the signal Dcont1 (a carrier control signal) for controlling the base current or the gate voltage of the certain carrier amplifier (for example, the buffer amplifier 121) to the carrier control circuit 170. With the above configuration, since the saturation state and the gain of the carrier amplifier (for example, the output amplifier 123) in the Doherty amplifier circuit are capable of being adjusted, it is possible to prevent the damage of the power amplifier module 100.

The carrier output circuit 160 in the power amplifier module 100 outputs the signal Dcont1 (the carrier control signal) based on the base current or the gate current of the output amplifier 123 (the carrier amplifier) at the output side in the carrier circuit 120. The carrier control circuit 170 controls the base current or the gate voltage of the certain carrier amplifier (for example, the buffer amplifier 121) based on the signal Dcont1 (the carrier control signal). With the above configuration, since the saturation state and the gain of the output amplifier 123 at the output side in the Doherty amplifier circuit are capable of being adjusted, it is possible to prevent the damage of the power amplifier module 100.

The carrier control circuit 170 in the power amplifier module 100 performs control so that the bias to be supplied to the base or the gate of the certain carrier amplifier (for example, the buffer amplifier 121) is decreased based on the signal Dcont1 (the carrier control signal). With the above configuration, since the saturation state of the output amplifier 123 at the output side is relived, it is possible to prevent the damage of the power amplifier module 100, which is caused by the saturation of the output amplifier 123.

The power amplifier module 200 further includes the peak output circuit 261, which outputs the signal Dcont2 (a peak control signal) based on the base current or the gate current of the output amplifier 233 at the output side in the peak circuit 230, and the control output circuit 262 (a first output circuit), which supplies the signal Dcont3 (a first control signal) for controlling the carrier control circuit 270 to the carrier control circuit 270 based on the signal Dcont1 (the carrier control signal) and the signal Dcont2 (the peak control signal). The carrier control circuit 270 controls the base current or the gate voltage of the certain carrier amplifier (for example, the buffer amplifier 221) based on the signal Dcont3 (the first control signal). With the above configuration, it is possible to increase the bias point of the carrier circuit 220 before the load impedance of the carrier circuit 220 is decreased to suppress the reduction in the gain.

The power amplifier module 200 further includes the peak output circuit 261, which outputs the signal Dcont2 (the peak control signal) based on the base current or the gate current of output amplifier 233 at the output side in the peak circuit 230; the control output circuit 262 (a second output circuit), which outputs the signal Dcont3 (a second control signal) for controlling the base current of a certain peak amplifier in the peak circuit to the peak control circuit 271 based on the signal Dcont1 (the carrier control signal) and the signal Dcont2 (the peak control signal); and the peak control circuit 271, which controls the base current or the gate voltage of a certain peak amplifier (for example, the buffer amplifier 231) based on the signal Dcont3 (the second control signal). With the above configuration, it is possible to increase the bias point of the carrier circuit 220 before the load impedance of the carrier circuit 220 is decreased to suppress the reduction in the gain. In addition, if the peak circuit 230 is saturated in a state in which the carrier circuit 220 is not saturated due to an external factor, it is possible to suppress the failure of the peak circuit 230 due to further input of power into the peak circuit 230.

The carrier circuit 120 in the power amplifier module 100 includes multiple carrier amplifiers (for example, the buffer amplifier 121, the driver amplifier 122, and the output amplifier 123) that are connected in series to each other. The certain carrier amplifier is the buffer amplifier 121 at the input side in the carrier circuit 120. The carrier control circuit 170 controls the base current or the gate voltage of the buffer amplifier 121 at the input side based on the signal Dcont1 (a carrier control signal). With the above configuration, it is possible to more efficiently adjust the saturation state of the carrier circuit 120 in the Doherty amplifier circuit.

The peak circuit 230 in the power amplifier module 200 includes multiple peak amplifiers (for example, the buffer amplifier 231, a driver amplifier 232, and the output amplifier 233) that are connected in series to each other. The certain peak amplifier is the buffer amplifier 231 at the input side in the peak circuit 230. The peak control circuit 271 controls the base current or the gate voltage of the buffer amplifier 231 at the input side based on the signal Dcont3 (the second control signal). With the above configuration, it is possible to more efficiently adjust the saturation states of the carrier circuit 220 and the peak circuit 230 in the Doherty amplifier circuit.

The carrier control circuit 380 in the power amplifier module 300 is a variable attenuator that varies a characteristic when current to be supplied to the base of a certain carrier amplifier passes or a characteristic of alternating-current voltage to be applied to the gate of the certain carrier amplifier based on the signal Dcont4 (the carrier control signal). With the above configuration, it is possible to more efficiently adjust the saturation state of the carrier circuit 320 in the Doherty amplifier circuit.

The power amplifier module 300 further includes the control output circuit 362 (a peak output circuit), which outputs the signal Dcont4 (the peak control signal) based on the base current or the gate current of the output amplifier 333 at the output side in the peak circuit 330, and the peak control circuit 381, which is a variable attenuator that varies a characteristic when current to be supplied to the base of a certain peak amplifier passes or a characteristic of voltage to be applied to the gate of the certain peak amplifier based on the signal Dcont4 (the peak control signal). With the above configuration, it is possible to more efficiently adjust the saturation state of the peak circuit 330 in the Doherty amplifier circuit.

The power amplifier module 400 includes the carrier phase shifter 441 (a phase shifter), which varies the phase of a signal output from the carrier circuit 420, and the combiner 450, which combines the signal the phase of which is varied by the carrier phase shifter 441 (the phase shifter) with a signal output from the peak circuit 430 to output the combined signal. The carrier output circuit 460 supplies the signal Dcont5 (the carrier control signal) to the carrier control circuit 470 based on the frequency of the combined signal. With the above configuration, it is possible to more efficiently adjust the saturation state of the carrier circuit 420 in the Doherty amplifier circuit.

The embodiments are described above to facilitate the understanding of the disclosure and not to limit the disclosure for interpretation. The disclosure may be modified or changed without necessarily departing from the spirit or scope of the disclosure and equivalents of the disclosure are also included in the disclosure. In other words, modifications resulting from appropriate design change of the embodiments by the person skilled in the art are also included in the scope of the disclosure as long as the modifications include the features of the disclosure. The elements, the arrangement of the elements, and so on of the embodiments are not limited to the exemplified ones and may be appropriately modified.

REFERENCE SIGNS LIST

100, 200, 300, 400 power amplifier module
120, 220, 320, 420 carrier circuit
130, 230, 330, 430 peak circuit
160, 260, 360, 460 carrier output circuit
170, 270, 380, 470 carrier control circuit
271, 381 peak control circuit
262, 362 control output circuit

The invention claimed is:

1. A power amplifier module comprising:
a carrier circuit comprising a plurality of carrier amplifiers;
a peak circuit comprising at least one peak amplifier;
a carrier control circuit that is configured to control a base current or a gate voltage of a given carrier amplifier of the carrier circuit; and
a carrier output circuit that is connected to a carrier amplifier closest to an output of the carrier circuit, and that is configured to supply a carrier control signal to the carrier control circuit,
wherein the carrier control signal is configured to control the base current or the gate voltage of the given carrier amplifier.

2. The power amplifier module according to claim 1,
wherein the carrier output circuit is configured to output the carrier control signal based on a base current or a gate current of the carrier amplifier closest to the output of the carrier circuit, and
wherein the carrier control circuit is configured to control the base current or the gate voltage of the given carrier amplifier based on the carrier control signal.

3. The power amplifier module according to claim 1, wherein the carrier control circuit is configured to decrease a bias supplied to a base or a gate of the given carrier amplifier based on the carrier control signal.

4. The power amplifier module according to claim 1, further comprising:
a peak output circuit configured to output a peak control signal based on a base current or a gate current of a peak amplifier closest to an output of the peak circuit; and
a first output circuit configured to supply a first control signal to the carrier control circuit based on the carrier control signal and the peak control signal, the first control signal being configured to control the carrier control circuit,
wherein the carrier control circuit is configured to control the base current or the gate voltage of the given carrier amplifier based on the first control signal.

5. The power amplifier module according to claim 1, further comprising:
a peak output circuit configured to output a peak control signal based on a base current or a gate current of a peak amplifier closest to an output of the peak circuit;
a second output circuit configured to output a second control signal configured to control a base current of a given peak amplifier of the peak circuit based on the carrier control signal and the peak control signal; and
a peak control circuit configured to control the base current or a gate voltage of the given peak amplifier based on the second control signal.

6. The power amplifier module according to claim 1,
wherein the plurality of carrier amplifiers that are connected in series to each other,
wherein the given carrier amplifier is a carrier amplifier closest to an input of the carrier circuit, and
wherein the carrier control circuit is configured to control a base current or a gate voltage of the carrier amplifier closest to the input of the carrier circuit based on the carrier control signal.

7. The power amplifier module according to claim 5,
wherein the peak circuit comprises a plurality of peak amplifiers that are connected in series to each other,
wherein the given peak amplifier is a peak amplifier closest to an input of the peak circuit, and
wherein the peak control circuit is configured to control a base current or a gate voltage of the peak amplifier at the input side of the peak circuit based on the second control signal.

8. The power amplifier module according to claim 1, wherein the carrier control circuit is a variable attenuator that is configured to vary a characteristic when a current supplied to a base of the given carrier amplifier is passed, or is configured to vary a characteristic of an alternating-current voltage applied to a gate of the given carrier amplifier based on the carrier control signal.

9. The power amplifier module according to claim 8, further comprising:

a peak output circuit configured to output a peak control signal based on a base current or a gate current of a peak amplifier closest to an output of the peak circuit; and a peak control circuit, which is a variable attenuator that is configured to vary a characteristic when current supplied to a base of a given peak amplifier is passed, or is configured to vary a characteristic of a voltage applied to a gate of the given peak amplifier based on the peak control signal.

10. The power amplifier module according to claim 1, further comprising:

a phase shifter configured to vary a phase of a signal output from the carrier circuit; and a combiner configured to combine the signal output from the carrier circuit with a signal output from the peak circuit, and to output a combined signal, the signal output from the carrier circuit having a phase that is varied by the phase shifter, wherein the carrier output circuit is configured to supply the carrier control signal to the carrier control circuit based on a frequency of the combined signal.

* * * * *